(12) United States Patent
Duncan et al.

(10) Patent No.: US 10,247,781 B2
(45) Date of Patent: Apr. 2, 2019

(54) COMPACT ELECTRONICS TEST SYSTEM HAVING USER PROGRAMMABLE DEVICE INTERFACES AND ON-BOARD FUNCTIONS ADAPTED FOR USE IN PROXIMITY TO A RADIATION FIELD

(71) Applicant: The United States of America as represented by the Secretary of the Navy, Washington, DC (US)

(72) Inventors: Adam Duncan, Bloomington, IN (US); Matthew Gadlage, Bloomington, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 362 days.

(21) Appl. No.: 15/380,131

(22) Filed: Dec. 15, 2016

(65) Prior Publication Data
US 2017/0097390 A1    Apr. 6, 2017

Related U.S. Application Data

(63) Continuation of application No. 14/551,418, filed on Nov. 24, 2014, now Pat. No. 9,594,117.

(60) Provisional application No. 61/907,739, filed on Nov. 22, 2013.

(51) Int. Cl.
| | |
|---|---|
| *G01R 31/319* | (2006.01) |
| *G01R 3/00* | (2006.01) |
| *G01R 1/18* | (2006.01) |
| *G01R 31/317* | (2006.01) |

(52) U.S. Cl.
CPC ......... *G01R 31/31905* (2013.01); *G01R 1/18* (2013.01); *G01R 3/00* (2013.01); *G01R 31/31728* (2013.01); *G01R 31/31914* (2013.01); *Y10T 29/49002* (2015.01)

(58) Field of Classification Search
CPC .......................... G01R 1/0416; G01R 1/0466; G01R 1/06705; G01R 1/18; G01R 31/2886
See application file for complete search history.

(56) References Cited

U.S. PATENT DOCUMENTS

| | | | |
|---|---|---|---|
| 4,571,724 A | * 2/1986 | Belmondo | ..... G01R 31/318385 714/724 |
| 5,442,146 A | 8/1995 | Bell et al. | |

(Continued)

*Primary Examiner* — Tung X Nguyen
(74) *Attorney, Agent, or Firm* — Christopher A. Monsey

(57) ABSTRACT

Various apparatus and methods associated with a compact electronics test system having user programmable device interfaces and on-board functions adapted for use in various environments are provided. Exemplary embodiments can include a variety of apparatuses and methods to realize an advanced field programmable gate array adapted to perform functional tests on digital electronics within an exemplary 48-pin DIP footprint. One aspect of the invention can include a testing device comprised of components to produce a product that is inexpensive and consumable. A small size of an exemplary embodiment of the invention further allows for desirable shielding to be placed around a highly portable and highly programmable and adaptable testing device in order to protect it from external dangers found in harsh environments (e.g., high levels of radiation when operating in space, etc.).

40 Claims, 14 Drawing Sheets

(56) References Cited

U.S. PATENT DOCUMENTS 5,914,902 A * 6/1999 Lawrence ........ G01R 31/31908
365/189.05
2014/0316537 A1 10/2014 Reed et al.

* cited by examiner

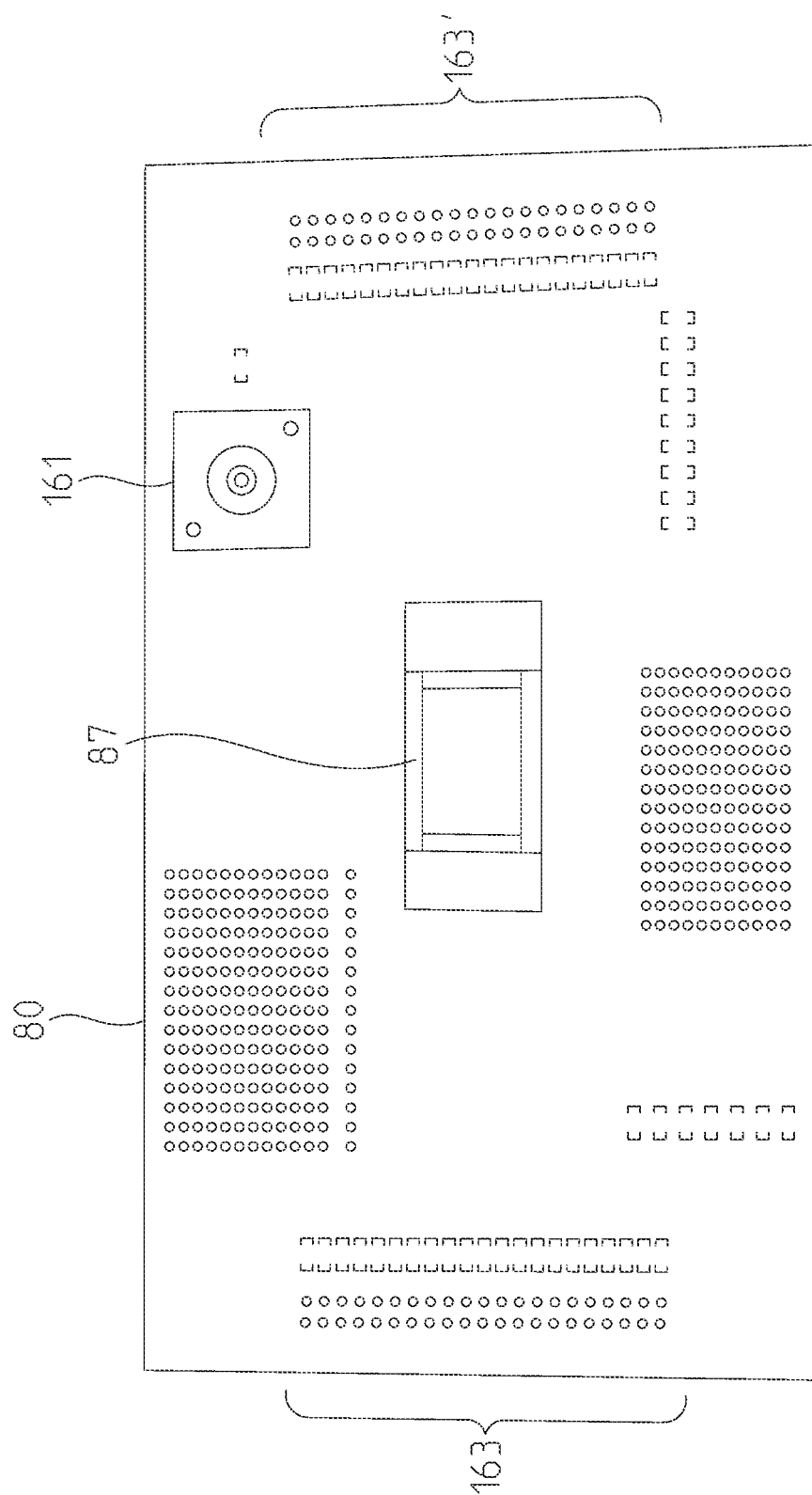

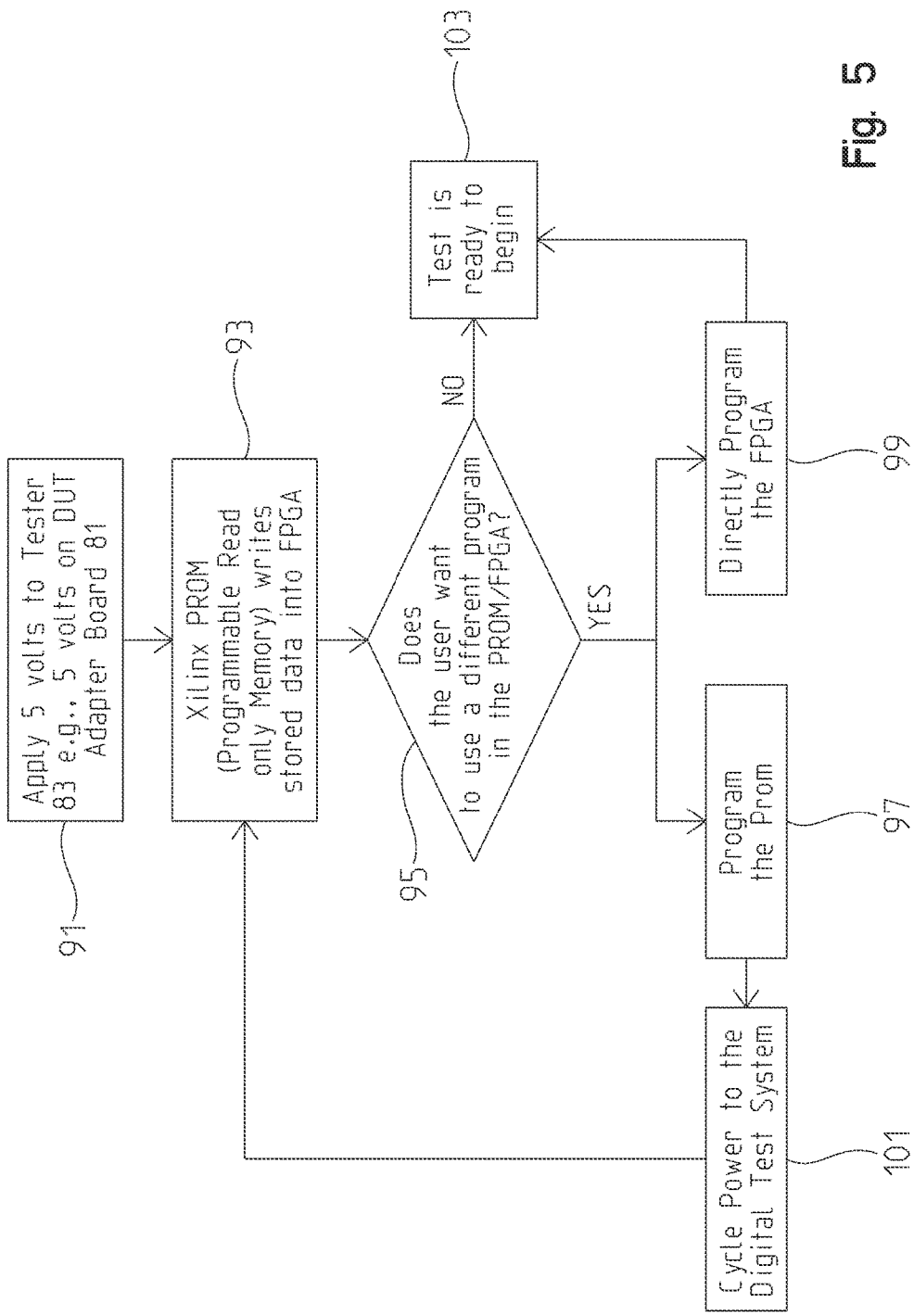

COMPACT ELECTRONICS TEST SYSTEM HAVING USER PROGRAMMABLE DEVICE INTERFACES AND ON-BOARD FUNCTIONS ADAPTED FOR USE IN PROXIMITY TO A RADIATION FIELD

CROSS-REFERENCE TO RELATED APPLICATIONS

The present application claims priority to U.S. non-provisional patent application Ser. No. 14/551,418, filed Nov. 24, 2014 Now U.S. Pat. No. 9,594,117, entitled "COMPACT ELECTRONICS TEST SYSTEM HAVING USER PROGRAMMABLE DEVICE INTERFACES AND ON-BOARD FUNCTIONS ADAPTED FOR USE IN PROXIMITY TO A RADIATION FIELD," which claims priority to U.S. Provisional Patent Application Ser. No. 61/907,739, filed Nov. 22, 2013, entitled "COMPACT ELECTRONICS TEST SYSTEM HAVING USER PROGRAMMABLE DEVICE INTERFACES AND ON-BOARD FUNCTIONS ADAPTED FOR USE IN PROXIMITY TO A RADIATION FIELD," the disclosures of which are expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,387) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE INVENTION

The field of the invention is related to digital electronic test systems. In particular, embodiments of the invention includes one that are related to systems that perform functional tests on digital electronic components through the use of a testing board with multiple programmable and reconfigurable components capable of interfacing with a significant number of different device under tests (DUT). Embodiments of the invention include examples that are suitable for a diverse set of programmable functionality as well as ones including a DUT interface board that are inexpensive to produce and small in size, relatively self-contained, capable of a highly diverse set of testing operations, and usable in various environments. Exemplary embodiments include ones suitable for allowing them to be more easily shielded for their use in harsh environments, for example environments of high radiation exposure or heat.

BACKGROUND AND SUMMARY OF THE INVENTION

There is a need for a digital electronics test system that is inexpensive to produce and small enough to be easily portable and shielded in harsh environments while still being capable of performing desired functional tests on electrical systems. Current systems used to test digital components are large and expensive to create. Existing testers are often extremely heavy, bulky, and not easily portable. Existing systems also are not suitable for use in various testing environments such as radiation testing or operational configurations where radiation is present. New capabilities are needed to meet needs associated with electronic testing, particularly ones that operate in harsh radiation environments (e.g., test spaces or space environments). One requirement for certain embodiments include one that the key components of test systems are not exposed to radiation or require less shielding than existing systems when testing, end-use, or operations are done in high stress environments such as radiation environments.

Existing test devices are large and expensive to produce and maintain, costing in excess of $10,000 which limits a test devices ability to be easily discarded in the event of radiation damage. Moreover, DUT interface boards generally must be created specifically for a DUT that needs to be connected to the testing device, which adds to the expense.

An exemplary embodiment of the present invention can be designed to utilize an electronics device interface structure, e.g., a 48-pin Dual-Inline Package (DIP) footprint, and perform functional tests on digital electronics (e.g., memories, microprocessors, application specific integrated circuits (ASIC), and analog-to-digital converters (ADC)) with a highly adaptable and programmable set of test structure interface, power, programming, communication, memory, backup, and control structures.

Embodiments of the invention can utilize structures for maximizing flexibility with respect to DUT interfaces. For example, embodiments can be created for interfaces such as IC, package, electrical device, or microelectronic footprint or electrical interfaces such as zero insertion force (ZIF) sockets and surface-mount technology (SMT) packages such as plastic leaded chip carrier (PLCC) and small-outline integrated circuit (SOIC).

Aspects of this invention may also be used to replace a variety of digital logic devices (e.g., Static Random-Access Memory (SRAM), microcontrollers, flip-flops, and logic gates). One example can include a DUT which is coupled to a tester structure through interface(s) by, for example, a DUT board. Another embodiment also can incorporate an adapter board which couples between the tester structure and the DUT board.

One aspect of an embodiment of the invention permits testing of digital electronics in harsh environments. An exemplary system can fit within a forty eight-pin DIP footprint that is capable of performing tests on digital electronic systems while being small enough to be highly portable and capable of being shielded properly when exposed to high levels of radiation in harsh environments (e.g., space). Exemplary aspects of an embodiment of the invention can be small enough to fit within a structure of a DUT board. Some embodiments can include a structure adapted to position a DUT over an aperture in supporting structure, such as a DUT board or another structure, which permits radiation in a test or operational environment to pass through the aperture with radiation sensitive supporting structures or components positioned around the aperture. The aperture also permits radiation source vectors to be applied to either side of a DUT and minimize direct exposure of radiation sources that otherwise pass directly through a DUT or component placed in a position of a DUT.

One aspect of the invention can include an advanced Field Programmable Gate Array (FPGA) based test system placed within a tester structure having an interface with a DUT interface structure that receives the DUT. An exemplary tester structure can have dimensions of approximately 0.6 inches by 2.4 inches. Small sized tester structure coupled with such a DUT interface structure enable, for example, an entire test system incorporating a forty eight-pin DIP package footprint. An exemplary embodiment of a tester structure can be constructed to include, e.g., forty programmable input/outputs (I/O) which can be set to operate at different voltage levels and enabled to toggle at, e.g., a high frequency. An exemplary embodiment of the present disclosure is small and light enough that it allows for the invention to be easily transportable and capable of more easily being shielded from harsh environments.

An embodiment of the invention avoids a need for designing and building a custom DUT interface and DUT boards in all or most cases where a DUT is suitably sized relative to an interface of an embodiment of the invention.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIG. 4d shows a top view of an exemplary DUT board with a DUT inserted;

FIG. 5 shows an overview of an initialization of the digital test system in accordance with one embodiment of the invention;

DETAILED DESCRIPTION OF THE DRAWINGS

Figure 1:
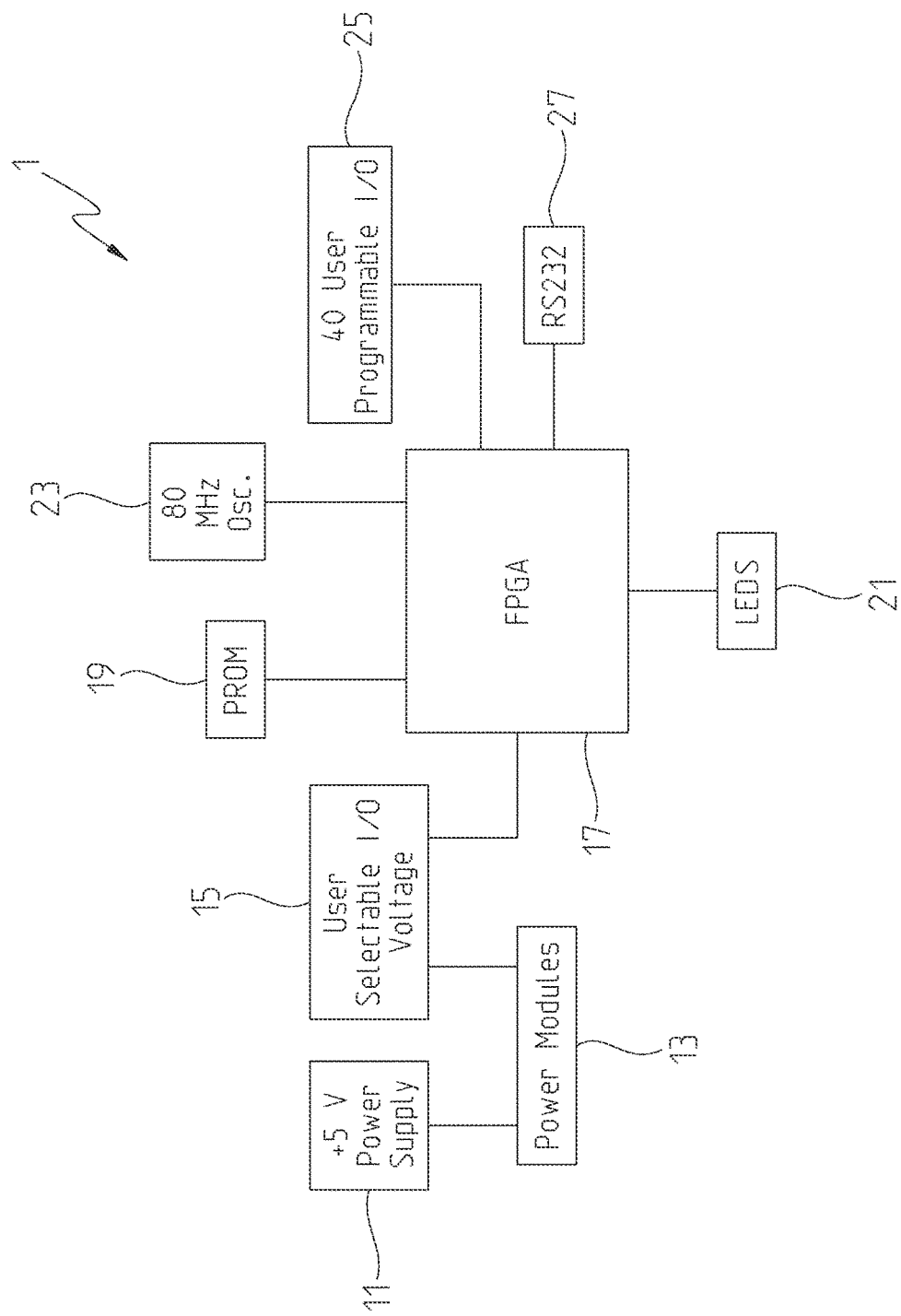
FIG. 1 shows an exemplary block diagram of a programmable digital test system.

The embodiments of the invention described herein are not intended to be exhaustive or to limit the invention to precise forms disclosed. Rather, the embodiments selected for description have been chosen to enable one skilled in the art to practice the invention.

In general, according to an illustrative embodiment of the invention, one variant of an exemplary test system can include a FPGA based system that is placed on a tester structure, e.g., a printed circuit board with a footprint of 0.6 in×2.4 in dimensions that works with one or more test system interface structures. One embodiment can be designed to ensure that an entire exemplary test capability accommodates a standard forty-eight-pin DIP footprint which programmably interfaces to a DUT in a variety of ways. An embodiment of the invention can have forty programmable I/O structures which can be set to operate at, e.g., 1.2V, 1.5V, 1.8V, 2.5V, and 3.3V via a user selectable FPGA VDD (supply voltage) I/O select switch. Exemplary voltages can be selected based upon available voltages associated with components or lowest achievable voltages that still allow for full operation of an exemplary test system. Exemplary I/Os can be controlled through an FPGA and are capable of toggling at frequencies over 300 MHz. One embodiment of the invention permits use of at least one user-programmable Light Emitting Diode (LED) constructed into an exemplary test system for use as, for example, a status, test, or Go/No-Go indicators. An exemplary embodiment of the invention can be connected to a computer system through an RS232 serial port to accommodate further calculations and compilation of raw data collected from an exemplary test system. An embodiment of the invention can be powered by a single small battery source, e.g., 5V source, rather than a bulky power supply system which can be on-board a test system or connected through a cable.

In one example, a DIP interface structure can be used. DIPs, sometimes called a DIL-package (for Dual In Line-package), can include an electronic device package with a rectangular housing and two parallel rows of electrical connecting pins. The pins are all parallel, point downward, and extend past the bottom plane of the package at least enough to be through-hole mounted to a printed circuit board (PCB), i.e. to pass through holes on the PCB and be soldered on the other side. DIP is sometimes, perhaps incorrectly, considered to stand for dual in-line pin, in an effort to address a redundant term "DIP package" (Dual in-line pin would imply one line of two pins). Generally, in one set of embodiments, the term DIP can be relatively broadly defined to include any rectangular package with two uniformly spaced parallel rows of pins pointing downward, whether it contains an integrated circuit (IC) chip or some other device(s), and whether the pins emerge from the sides of the package and bend downwards or emerge directly from the bottom of the package and are completely straight. In some more specific usages, the term can refer to an IC package of the former description (with bent leads at the sides.) A DIP can be referred to as a DIPn, where n is the total number of pins. For example, a microcircuit package with two rows of seven vertical leads would be a DIP14. DIPs may be used for semiconductor integrated circuits (ICs, "chips"), like logic gates, analog circuits, and microprocessors. They may also be used for other types of devices including arrays of discrete components such as resistors (often called resistor packs), arrays of miniature rocker or slide switches known as DIP switches, various LED arrays including segmented and bar graph displays and light bars, miniature rotary encoder switches, and electromechanical relays. Integrated circuits and resistor arrays can have bent leads (leads are one type of IC package connector; other types are pins, as well as balls) which extend from the sides of the package and turn to point downward. Other types of DIP components, e.g., LED devices, can have completely straight leads extending directly from the bottom/back of the package, which can utilize molded plastic and can be any color. Other embodiments of the invention can employ other types of board-to-board (BTB) connectors used to connect different microelectronic components, e.g., PCB, electronic components that contain a conductive pattern printed on the surface of the insulating base in an accurate and repeatable manner. In some examples, each terminal on a BTB connector is connected to a PCB. A BTB connector can include housing and a specific number of terminals. Exemplary terminals can be made from a conductive material (e.g., mostly copper alloy), and plated to improve conductivity and antirust. Terminals transmit the current/signal between PCBs connected by BTB; the housing can made of insulating material (e.g., mostly plastic).

According to a further illustrative embodiment of the present disclosure, an embodiment of the invention can have multiple uses beyond merely being used as a tester. For example, a unique forty-eight-pin DIP design and the user programmable testing and interface features of an exemplary embodiment allows an exemplary testing system to include or be used as SRAM, microcontrollers, flip-flops, simple logic gates, oscillator, etc., as a secondary functionality beyond testing. An embodiment of the disclosure, given its small size and footprint, could also be used as an FPGA evaluation board ideal for prototyping designs on a breadboard. Such a system can have a dual use application i.e. operational and testing features that operate or are available as an end item as well as in conjunction with an end item or in an installed configuration of a DUT. For example, interface structures can include a signal or data bus which couples an exemplary tester with other systems where the tester can perform non-testing functions, such as described above, as well as operate in a testing mode relative to a DUT, either in a test coupling mode or in an in-service or installed configuration mode. A method of operation can include providing or installing a tester and interfaces such as described herein, operating the tester to perform non-test functions, and selectively coupling the tester with a DUT to perform a plurality of test operations on the DUT, then producing a test output.

Embodiments of the invention can be a single DUT board interfacing or coupling an exemplary tester and a DUT, as well as other components and providing input and output capabilities. Another embodiment of the invention can be a DUT attached to a DUT housing or interface board which is separate from, and able to be attached to, a DUT adapter board housing a testing device and all other components. Other embodiments include other combinations of separate boards containing system components which are able to be attached and integrated with each other's separate parts as well as providing necessary testing, interface, and I/O capabilities in accordance with an embodiment of the invention.

Aspects of the invention which enable operation in proximity to a radiation field include placing the tester relative to a DUT in such a way that radiation testing on the DUT does not damage or interfere with operation of the tester, interfaces with the tester, or operation of I/Os coupling with external devices such as a computer. For example, a tester structure can be designed to be small, e.g. limited footprint with interface, controller (e.g., FPGA), communication, memory, and thus have a reduced amount of shielding e.g., lead or other material or structures which deflect or block radiation. Another design feature is to create a low cost system which is capable of operating until radiation causes sufficient damage to render the tester unserviceable. At a point where a tester unit is unserviceable, it is removed and replaced. In a remote application, either a tester can be remotely replaced or a bank of testers can be selectively uncovered, positioned, or placed into a radiation environment and thereby create a bank of testers that can be used/jettisoned or rotated into operation to give a limited replacement ability afforded due to small size and cost. A variety of methods of manufacturing or use could be utilized in conjunction with various embodiments of the invention to include providing a remote part replacement or repositioning/coupling system available for coupling an embodiment of the invention with a DUT in a stress operating or testing environment (e.g., heat, radiation, corrosive chemical, or other damaging environments); providing one or a plurality of embodiments of the invention, e.g., one or more portable testers adapted for use with the remote part replacement or repositioning/coupling system in the stress environment; coupling a DUT with at least one of the one or plurality of embodiments of the invention; operating the one or plurality of embodiments of the invention in the stress environment; detecting a failure of at least one of the one or plurality of embodiments of the invention; operating the remote part replacement or repositioning/coupling system to replace or couple another of the plurality of embodiments of the invention with the DUT or another DUT. Another embodiment of a method or apparatus can include designing components on at least some or all of embodiments of the invention, e.g., tester, to be remotely replaceable by, e.g., the remote part replacement or repositioning/coupling system (e.g., using zero insertion force sockets or other sockets or coupling structures which permit remote removal and replacement; also providing alternate operability structures such as a backup voltage bus to permit switching from a damaged voltage regulator to a backup bus system by means of an switching and control mechanism(s) that are disposed in a variety of locations relative to various components of the invention e.g., on a tester, on a DUT board, on an adapter board which are connected via various configurations of interface busses and mechanical connections such as an adapter card slot or card edge connectors, etc.); detecting components on embodiments of the invention that are defective or rendered inoperable by, e.g., the stress environment; and operating the remote part replacement or repositioning/ coupling system to remove and replace a component or activate/deactivate bus or other types of connections (to include optical, holographic, etc.).

Referring initially to FIG. 1, an exemplary block diagram of a programmable Tester 1 is shown. A single exemplary tester can have components, such as described with block diagrams of components in FIG. 1, may be disposed on a tester circuit board and interfaced with a DUT board (not shown) or multiple exemplary testers may be placed on the same DUT board (not shown) in order to test more than one digital electronic system simultaneously or can be sequenced to add to the overall computing capability of an exemplary test system. An exemplary programmable Tester 1, such as shown in FIG. 1, includes a power supply 11 section that receives or supplies 5V of power required to run an embodiment of the invention. In one embodiment, the power supply section 11 is connected to the Tester 1 and is directed to at least one power module 13 which is a modulator that modulates the voltage supplied to User Selectable I/O 15 between exemplary values of 1.2V, 1.5V, 1.8V, 2.5V, or 3.3V. The exemplary power module 13 can be connected to the User Selectable I/O Voltage 15 component which has a voltage control switch which allows the user to select a desired or required voltage. An FPGA 17 is coupled to various components on the Tester 1, e.g. the User Selectable I/O Voltage 15, and can receive inputs adapted to program the FPGA e.g., be programmed in hardware description language (HDL) specifically for an operation or test to be run on a DUT (not shown but connected to the Tester 1) e.g., digital electronics. The exemplary FPGA 17 can be connected to a Programmable Read Only Memory (PROM) 19 to ensure that said FPGA 17 is reloaded or maintains its previous setting and is not required to be reprogrammed each time power is removed from the exemplary Tester 1 circuit board or components thereon. The exemplary FPGA 17 can use an 80 MHz oscillator 23 for timing or clock operation. The exemplary FPGA 17 can be programmed to multiply or scale/adjust an exemplary onboard Oscillator 23 to generate a higher oscillation frequency clock signal if desired. An exemplary Forty Programmable I/O Structure 25 can be connected to the exemplary FPGA 17 through conductive printed circuit board traces forming part of the Tester 1 assembly. Indicators such as LEDs 21 can be connected to the FPGA 17 and may be used as, e.g., as indicators to show when certain user programmed criteria are met. For example, the exemplary LEDs 21 can be programmed through the exemplary FPGA 17 to show a high signal associated with a DUT (not shown) and indicate through the LEDs 21 that the high signal was activated or detected by the FPGA 17. LEDs 21 can also be operated by the FPGA 17 to show that power is being supplied, a proper or desired test is being conducted, as an indicator that a test being run has passed, or for any other checks or indications that the user may want to visually show on the tester itself for visual signaling to the user. The exemplary FPGA 17 can also interface with a portable or other type of suitable computer (e.g., a personal computer, tablet, control system, etc.) where raw data from the FPGA 17 can be sent to the suitable computer or processor through an exemplary interface, e.g., a RS232 Serial Port 27 communication protocol/structure.

Figure 2:
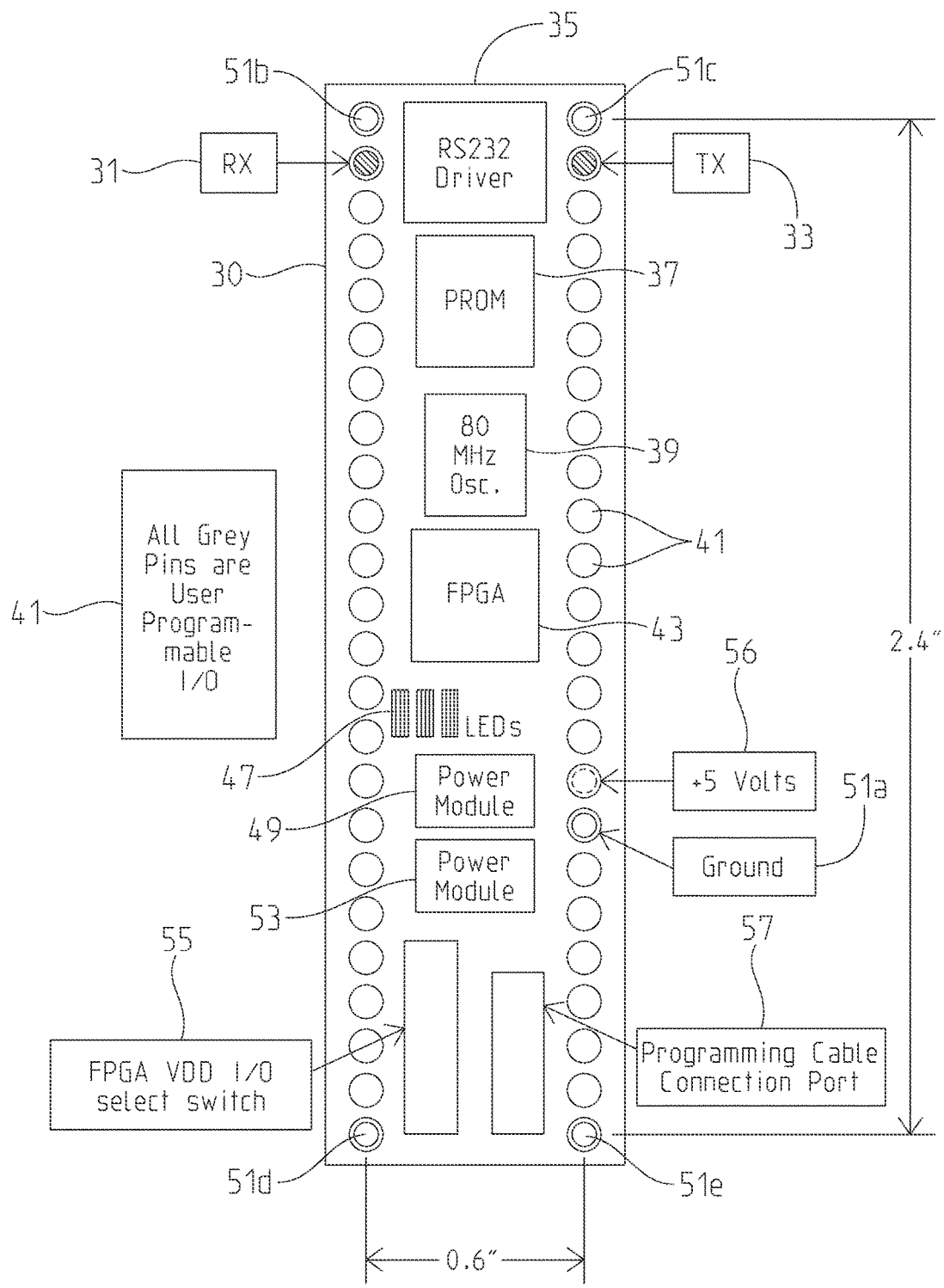
FIG. 2 shows an exemplary functional diagram of aspects of the invention and how it can be arranged on in a 48-pin DIP footprint.

FIG. 2 shows an exemplary functional diagram of one aspect of an embodiment of the invention and how components can be arranged on an exemplary 48-pin DIP 30 footprint. Depicted in FIG. 2 are forty eight circular drawing elements running along two sides of the exemplary forty-eight-pin DIP 30 footprint, with two sets of twenty four circles respectively on two opposing sides of the DIP 30 footprint structure. Each of these forty eight circular drawing elements represents a single I/O that programmably couple and interacts with other elements of a test system and DUT. The exemplary forty eight I/Os are divided into 4 different groups. A first group of I/Os can include five grounds 51($a$-$e$). Each of these ground I/Os 51$a$, 51$b$, 51$c$, 51$d$, 51$e$ are depicted as a solid black circle. The next group of I/Os can include one voltage input I/O 56 depicted by a dotted circle. A third group of I/Os can include a receive (RX) I/O 31 and a transmit (TX) I/O 33. Receive I/O and transmit I/O (31, 33) are depicted by a circle with cross lines. A fourth group of I/Os can include forty remaining grey circles representing forty programmable I/Os 41 that can be programmed through the FPGA 43. An exemplary DUT (not shown), e.g., digital electronics to be tested, can be connected to the forty-eight-pin DIP 30 at the receiver I/O 31 so as to enable the tester to transmit information through the transmit I/O 33 to a RS232 structure/driver 35 then to an external device for analysis or storage of the transmitted information (e.g., a personal computer or an external memory storage device). A power source 11 can be connected to the FPGA VDD I/O select switch 55 where the user can select a voltage to be modulated and used with the DUT. The exemplary Tester can be grounded at the grounding locations 51$a$-51$e$. Voltage input from power input 55 can be routed to power modules 49 and power module 53 that are modulators that can modulate desired voltage for user programmable I/Os 41 between, for example, values of 1.2V, 1.5V, 1.8V, 2.5V, or 3.3V. FPGA 43 can be connected to a PROM 37, which can allow the FPGA 43 to retain user programmable or configuration settings if power is removed from some or all of an exemplary tester. Exemplary FPGA 43 can be programmed through a Programming Cable Connection Port 57. Exemplary FPGA 43 can also be connected to the FPGA VDD I/O Select Switch 55 that a user can operate manually or remotely to select desired voltage for the exemplary programmable I/Os 41. Exemplary FPGA 43 can also be connected to an 80 MHz Oscillator 39 that also is placed on board the Tester assembly to maintain timing within FPGA 43. Data or signals from exemplary FPGA 43 can be used to drive or operate LEDs 47 that can be operated by, e.g., FPGA 43 and its programming to indicate or communicate a number of different desirable user information requirements (e.g., power being supplied and Go/No-Go criteria being met on desired test raw data). Exemplary FPGA 43 can be programmed to interact with any number of the 40 user programmable I/O pins 41 to conduct a desired, predetermined, or appropriate test on a DUT (not shown). Data from exemplary FPGA 43 can also be sent to a RS232 Serial Port 35, which can connect the exemplary Tester's circuit board 30 to another system e.g., control system or personal computer to analyze or store raw data generated by or in response to Tester operations with respect to a DUT for a user.

If a DUT requires more than 40 I/Os to be tested the small size and easy programmability of said testers enable multiple exemplary testers to be linked together to add to processing capability of an overall test system. For example, a DUT with fifty pins could be coupled with two testers using twenty six pins from each tester where one tester is a master and the other is a slave, or specific functions can be programmed for groups of pins controlled by each FPGA and adapted to produce desired outputs either individually or collectively.

Figure 3A:
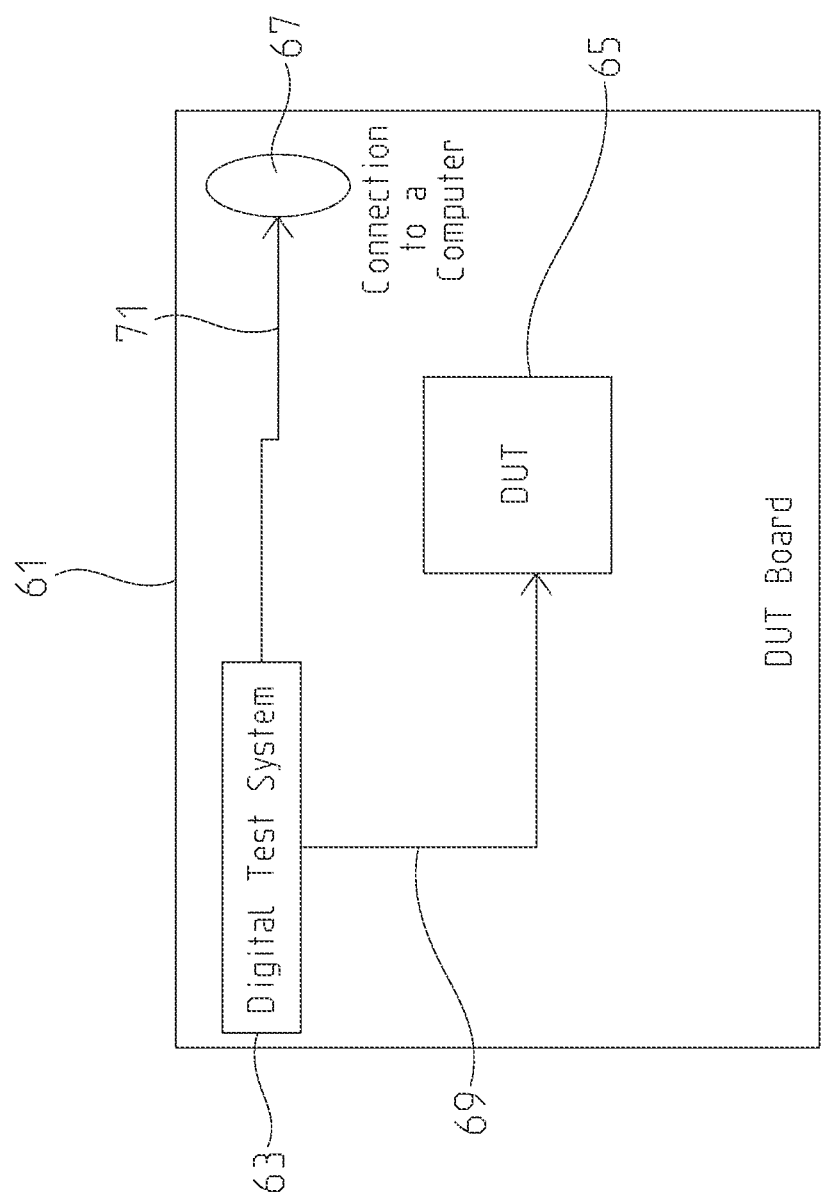
FIG. 3a shows a diagram of an exemplary a DUT, programmable digital test system, a DUT board, and a connection to a computer for analysis of data generated by an embodiment of the invention.

FIG. 3$a$ shows an exemplary depiction of a DUT Board 61 as well as an exemplary DUT 65, a programmable digital test system (e.g., Tester) 63, and a connection to a computer for analysis of data 67 generated by an embodiment of the invention disposed on the DUT Board 61. The FIG. 3$a$ Digital Test System (Tester) 63 can include a circuit board including a forty-eight-pin DIP coupled to the DUT 65 (e.g., digital electronics). In an exemplary embodiment of this invention, a small size of an exemplary programmable digital test system (e.g., Tester) 63 allows test system 63 to engage or interface with exemplary DUT board 61 so it is positioned in a necessary distance and configuration relative to a DUT 65. Exemplary test system 63 and DUT board 61 can be connected through, for example, circuit board interfaces such as card edge connectors or other types of selectively coupling/decoupling structures providing selectively configurable/connectable and disconnectable conductive tracks 69. Note, FIG. 3$a$ shows a connection structure 69 as a simplified depiction not showing structures associated with the selectively configurable/connectable and disconnectable feature. A selectively configurable/connectable and disconnectable feature can be provided by, for example, edge card connectors or other structures adapted to couple, e.g., printed circuit boards such as a Tester with another printed circuit board such as the DUT board 61. Other coupling structures can be used in accordance with an embodiment of the invention to include flexible structures or field induction structures as well as optical interfaces which enable signals to pass from tester 63 to the DUT board 61 or other structures in accordance with an embodiment of the invention. Exemplary test system 63 can be connected to a computer by signal interface (e.g., connection to a computer) 67 for analysis of data generated by test system 63 though an electrical connection 71 carrying, e.g., signals associated with RS232 connector 37.

Exemplary DUT 65 can also be separate from the DUT board 61 and connected only through a conductive track or structure 69 (e.g., a cable) leading from exemplary DUT 65 to DUT board 61 containing exemplary test system (e.g., tester) 63. An invention embodiment can allow a test system, including Digital Test System (e.g., Tester) 63, to be brought to a site of exemplary DUT and test the exemplary DUT without removal from the DUTs environment or operational configuration. A small size of an exemplary test system 63 (e.g., Tester) enables lighter weight and a reduction of required shielded from harsh environment(s) as well as quick and inexpensive replacement of components at different tiers if various aspect of the invention are damaged. For example, a test system (e.g., Tester) 63 can also be easily removed and replaced with another test system (e.g., another Tester) 63 that can be rapidly programmed to test different aspects of a said DUT 65, thereby allowing one DUT board 61 to quickly enable many different tests to be performed without changes or modifications to the DUT board 61 or other interface configurations e.g., DUT board 61 used in connection with an adapter board, etc. to connect to the test system (e.g., Tester) 63.

Figure 3B:
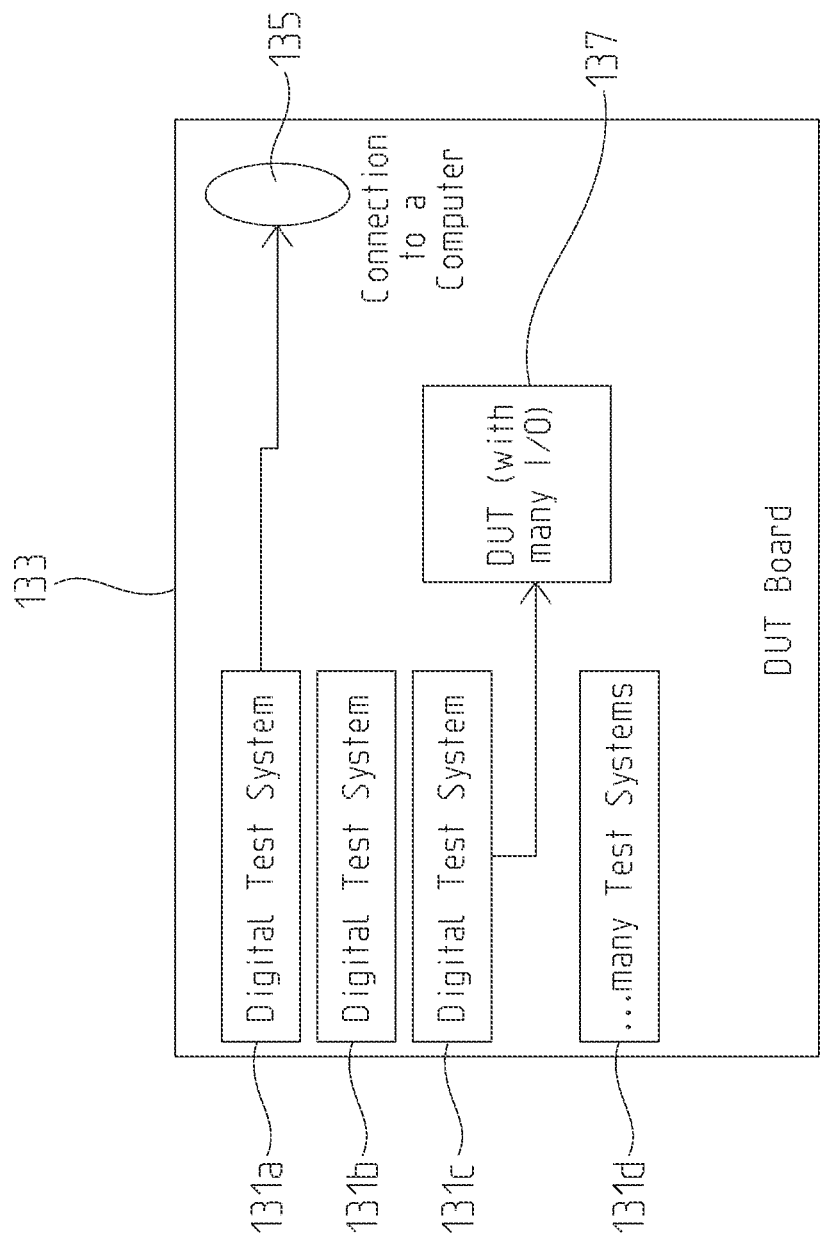
FIG. 3b shows an exemplary embodiment having multiple testers coupled with a DUT, and a DUT board.

FIG. 3b shows one example of how multiple digital test systems (e.g., Testers) 131a, 131b, 131c . . . 131n can be placed on a single DUT board 133 or multiple boards to increase capability or power of exemplary test systems or testers so that a test of a DUT 137 that has many I/Os can be accomplished. In one embodiment of the invention, exemplary Testers 131a-n could all be placed on the same DUT board 133 and connected by reconfigurable or removable structures forming selectively conductive tracks to one or more of each the Tester's I/Os. Functions and sequence(s) of the I/Os that can be connected or controlled by a user and/or be fully programmable by the user through an exemplary FPGA of at least one Tester (e.g., 131a, 131b, 131c, etc.). For instance, an exemplary FPGA of a first Tester (e.g., 131a) could be programmed to initiate other connected Testers (e.g., 131b) to perform their individual test sequence under the control of their own FPGA and transmit test data back to the first Tester (e.g., 131) to be outputted via an RS232 port to a computer 135 for analysis or an external memory device or system for storage for later analysis. Exemplary Tester(s) can be linked between programmable I/Os on other exemplary Tester(s). Many Testers can be contained on a relatively small DUT board 133 that is still lightweight and more easily shielded and operated in accordance with one aspect of the invention. In other embodiments exemplary Testers could be stacked, laid out side-by-side, placed on multiple DUT boards that are connected with external wiring, or in other configurations.

Figure 4A:
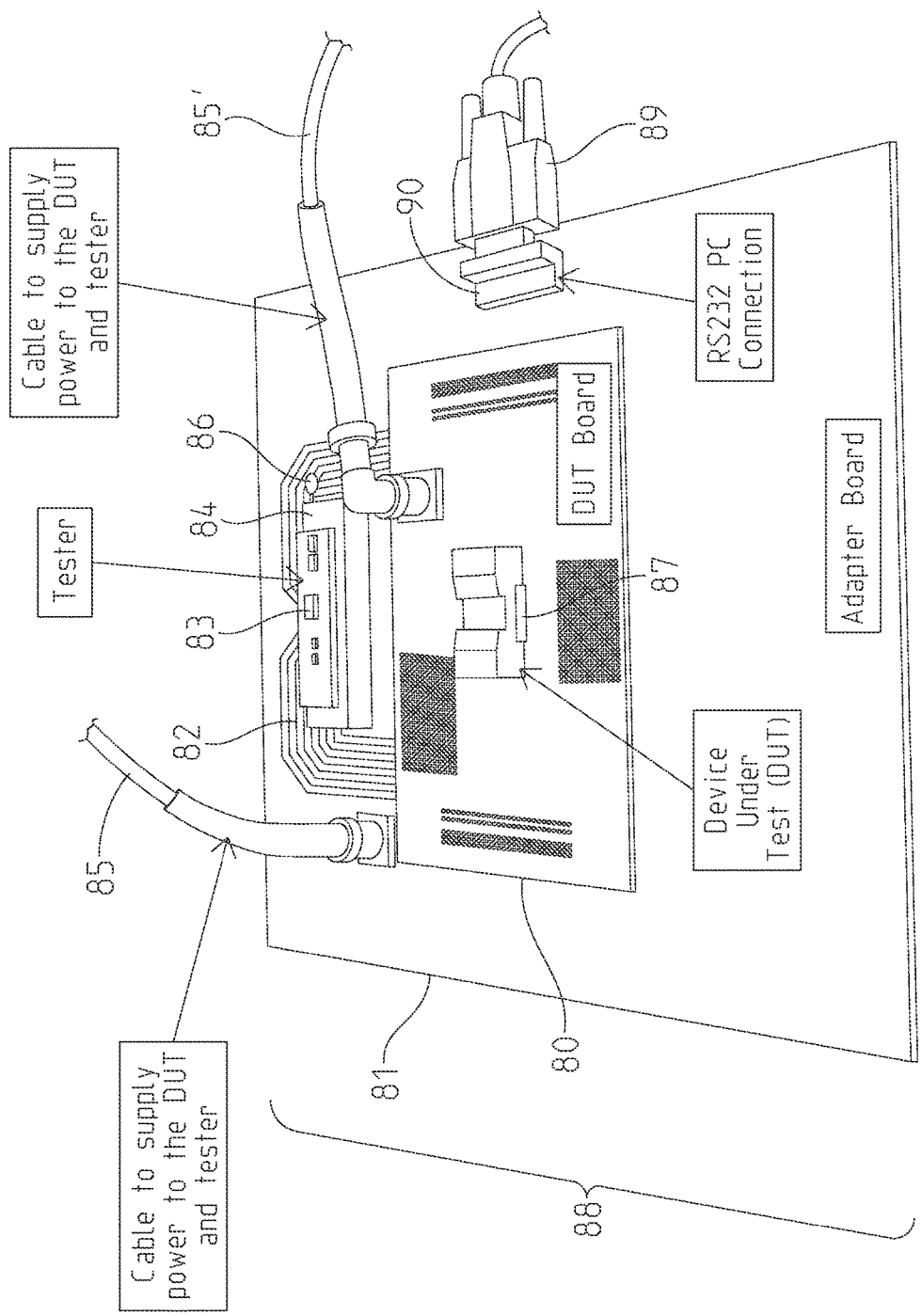
FIG. 4a shows a perspective view of aspects of an exemplary embodiment of the invention having a DUT, a tester, an adapter board, and a DUT board along wire interfaces.

FIG. 4a shows one operational example of an embodiment of the invention includes a DUT test assembly 88. In this embodiment, DUT test assembly 88 is comprised of an Adapter Board 81 supporting, coupling with, and removably attaching a Tester 83 and a DUT Board 80 with the DUT Board 80 removably coupling with a DUT 87 disposed over an aperture in the Adapter Board 81. Components coupled to the DUT Adapter Board 81 are electrically connected by way of conductive tracks 82 disposed on the Adapter Board 81. Exemplary DUT test assembly 88 can be designed and manufactured to a variety of desired user specifications. Various embodiments of the invention allows different DUT Boards to be designed to hold different DUTs with different pin configurations yet still be attached to a single configuration Adapter Board 81. In another embodiment, an exemplary DUT Board could be designed to hold a DUT and hold a Tester or designed to hold multiple Testers (not shown) and a DUT without the DUT Adapter Board 81. Tester 83 can be attached to exemplary DUT Adapter Board 81 by way of, e.g., a Zero Insert Force (ZIF) connection 84. Exemplary electrical signal connection between the ZIF connection 84 and the exemplary Tester 83 can be accomplished by way of a lever 86 that is moved 90 degrees to compress contacts between conductive tracks in different structures (e.g. Tester and adapter board) and thereby complete a connection between exemplary Tester 83 and exemplary adapter board(s) 81 conductive tracks. In another embodiment, exemplary Tester 83 could be connected to exemplary DUT Board 80 by a variety of combinations, e.g., ZIF connections or CPU socket that can accommodate an interface structure in accordance with an embodiment of the invention, e.g., a forty-eight-pin DIP. External power source(s) (not shown) can be connected to exemplary DUT Board 80 through cable(s) 85, 85'. Exemplary Tester 83 can be adapted or programmed to perform tests on exemplary DUT 87 and also indicate to a user information such as go/no-go criteria directly though test or operation indicators such as LEDs on the Tester 83 or can transmit raw data to an external computer for analysis though a RS232 connector 90 mounted to exemplary Adapter Board 81. RS232 connector 90 can be connected to exemplary Tester 83 to receive and transmit I/Os (e.g., see FIGS. 2, 31 and 33 respectively) via an interface such as conductive tracks 151 (shown on FIG. 4c) that are formed as a part of exemplary DUT Test Assembly 88. A RS232 cable 89 can connect RS232 connector 90 to another system, e.g., computer (not shown) for analysis of output data. Exemplary DUT 87 can be connected to an exemplary Tester 83 directly within the DUT Test Assembly 88 as shown or DUT 87 can be connected to DUT Board 80 though external connecting wires (not shown) while DUT 87 is still operating within a larger system. This exemplary configuration can allow a DUT 87 to be tested without having to remove a DUT 87 from its operational environment. An exemplary DUT Board 80 can be configured to be coupled to exemplary Tester 83, a power supply (not shown), and external connections to a memory storage device (not shown) for future analysis or direct connection to a computer for real time analysis, and can be shielded and transported to a DUT 87 operational site and attached using external wiring or connections without loss in in-situ performance. One embodiment can adapted for entry into harsh environments where a DUT 87 should not be removed and exemplary testers require protection.

Figure 4B:
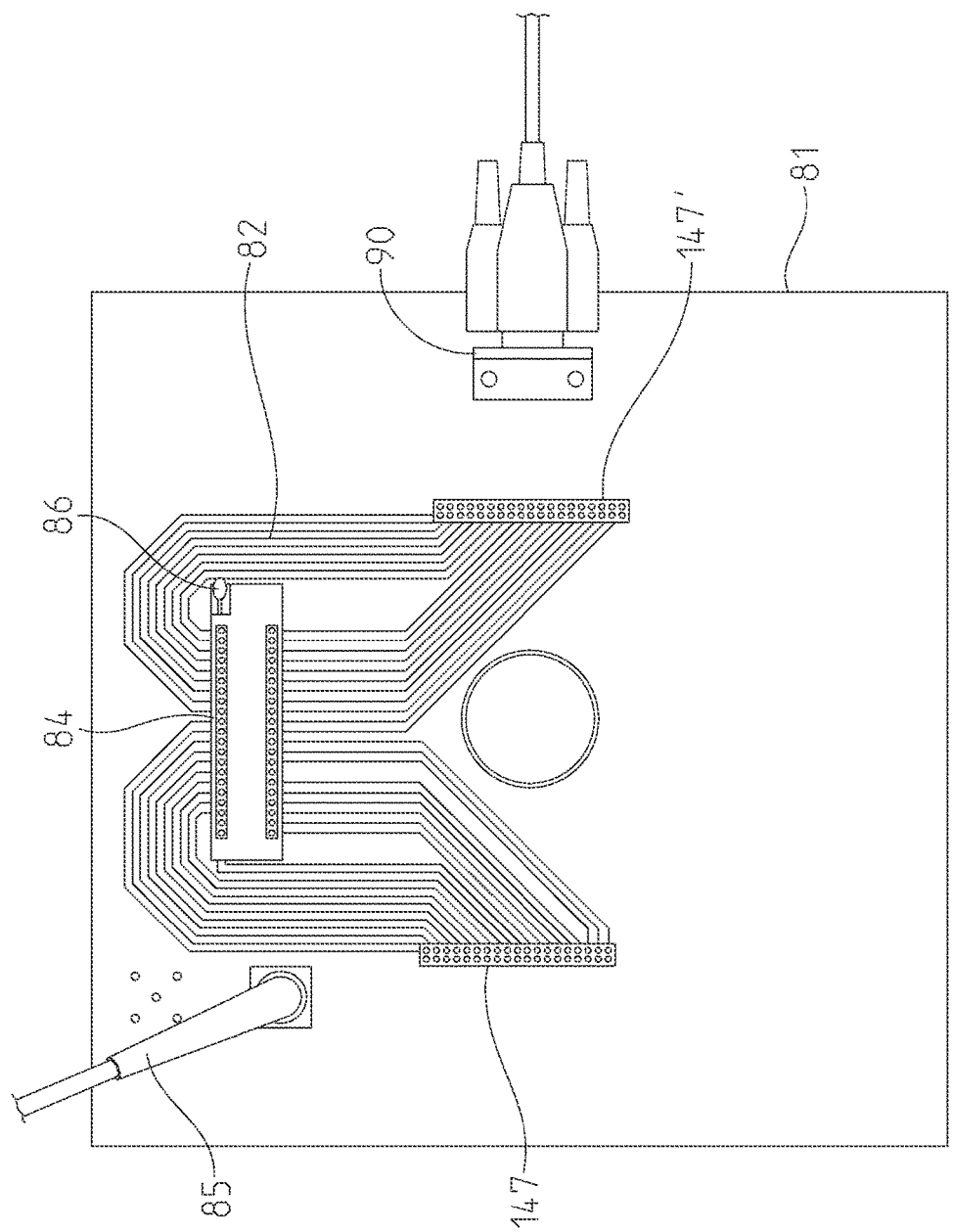
FIG. 4b shows a top view of an exemplary DUT adapter board portion of one embodiment of the invention, such as shown in FIG. 4a, with an exemplary DUT board and exemplary tester removed.

FIG. 4b shows a top view of exemplary DUT Adapter Board 81, such as shown in FIG. 4a, with DUT Board 80 and Tester 83 portions of DUT Test Assembly 88 removed. Component removal permits viewing of conductive tracks 82 underneath DUT Board 80 and Tester 83 showing exemplary connection from an exemplary Tester Connector 84 (e.g., ZIF socket) to exemplary interface or receptacle ports 147, 147' adapted to receive exemplary DUT Adapter Board 81. Interface or receptacle ports 147 can be signal bus interface connections suitable to receive plug-in pins or electrical interfaces from DUT Board 80 where the interface or receptacle ports 147, 147' comprise two separate signal interface structures disposed on opposing sides of an aperture in the DUT Adapter Board 81 where the aperture is formed in a center section of the DUT Adapter Board 81. Serial port 90 is also shown on an edge of the DUT Adapter Board 81. ZIF socket lever 86 is also shown as well as a power coupling and cable 85 which removably supplies power to the DUT Adapter Board 81. The FIG. 4*b* aperture formed in a center section of the DUT Adapter Board 81 is positioned underneath an exemplary DUT Board 80 (not shown) when the DUT Board 80 is installed so as to facilitate radiation testing of the DUT. The aperture permits various types of radiation testing which direct radiation through the DUT held on the DUT Board 80 through the aperture and thereby avoids disruption of the Tester 83 or DUT Board 80 by direct exposure to line of travel of radiation emissions and potentially also path dispersal or deflection of radiation emissions.

Figure 4C:
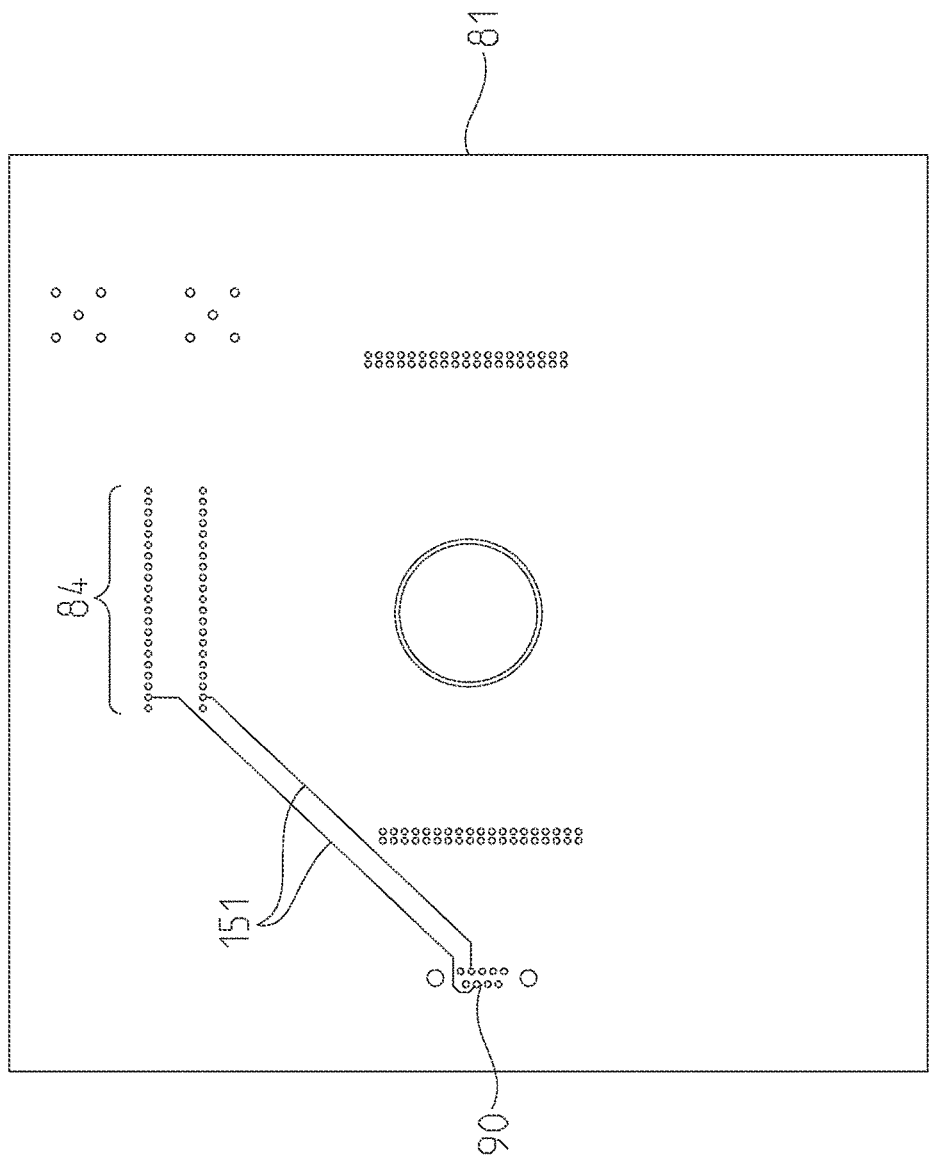
FIG. 4c shows a bottom view of an exemplary, e.g., FIG. 4b, DUT adapter board.

FIG. 4*c* shows a bottom view of an exemplary, e.g., FIG. 4*a*, 4*b*, DUT Adapter Board 81 from exemplary DUT Test Assembly 88. From this perspective, conductive tracks 151 that connect connectors, e.g., ZIF connector 84, to an interface, e.g., an RS232 connector 90. Again, the aperture providing a path to expose a bottom area of a DUT (not shown) through the DUT Adapter Board 81 is depicted in a center section of the DUT Adapter Board 81.

FIG. 4*d* shows a top view of an exemplary DUT Board 80 from exemplary DUT Test Assembly 88 with exemplary DUT 87 inserted. DUT Board 80 has conductive tracks that run from DUT 87 to various sections on the DUT Board 89 such as, e.g., connector pins 163, 163' (on either side of DUT Board 80 in this embodiment) to allow for DUT Board 80 to be removeably connected to exemplary DUT Adapter Board 81's (not shown) interface or receptacle ports 147, 147' (not shown) on DUT Adapter Board 81 (not shown). Exemplary Coaxial receptor 161 can be used to receive power cable 85' to supply power to exemplary DUT 87.

Figure 4E:
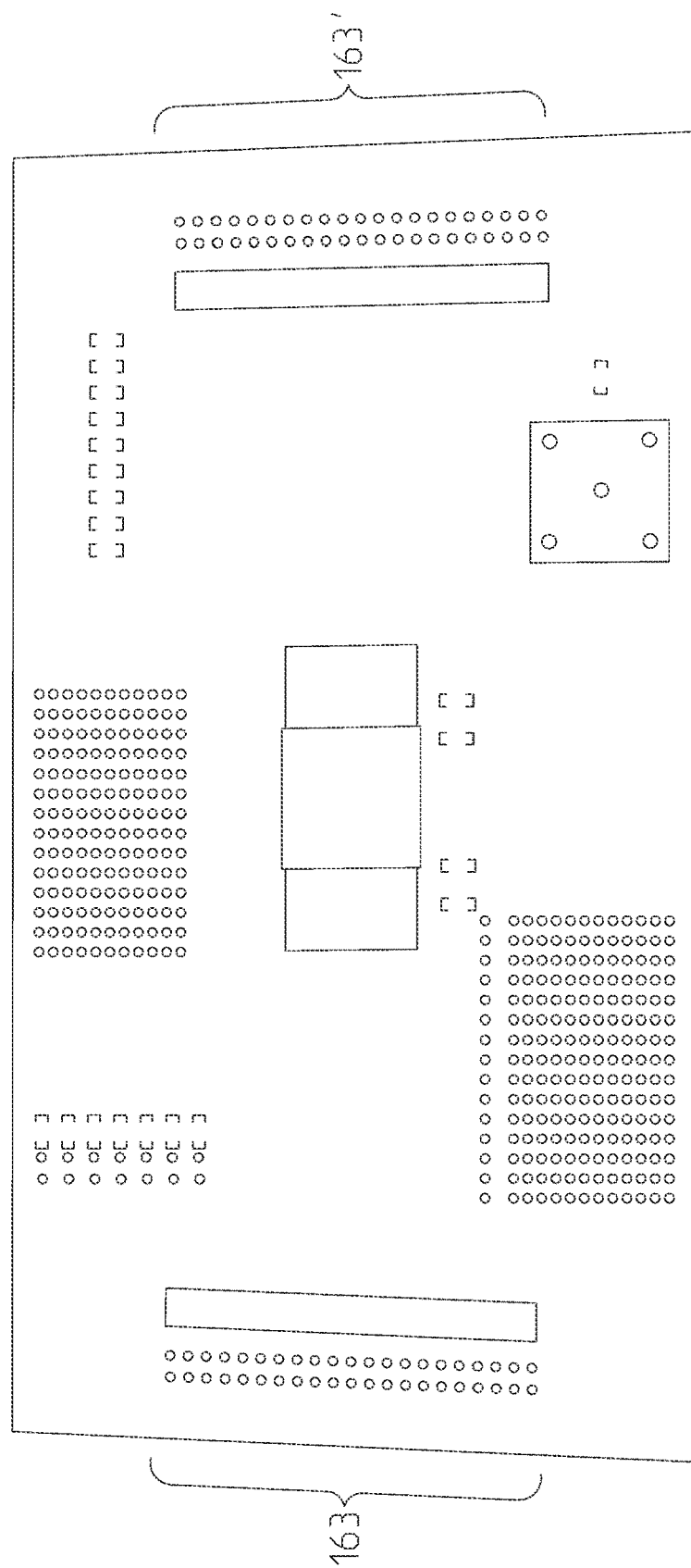
FIG. 4e shows a bottom view of an exemplary DUT board such as shown in FIG. 4d.

FIG. 4*e* shows a bottom view of an exemplary DUT Board 80 such as, for example, shown in FIG. 4*a*-4*d*. FIG. 4*e* shows example connector pins 163, 163 which connect to exemplary interface or receptacle ports 147, 147' to attach DUT Board 80 to exemplary DUT Adapter Board 81 (not shown).

FIG. 5 shows an overview of the initialization of an exemplary digital test system (e.g., DUT Test Assembly 88) in accordance with one embodiment of the invention. A user or operator would provide DUT Test System 88 with a desired DUT 87. Next, voltage is first applied to exemplary Tester (e.g., 83)(e.g., though a Bayonet Neill-Concelman (BNC) connector or by other means) at step 91. Exemplary PROM (e.g., 37) writes stored data that can comprise, e.g., a program such as test or initialization instructions and settings, into exemplary FPGA (e.g., 43) at step 93, which is then checked by a user to ensure that stored data is correct. Once said FPGA data is verified, the user checks to ensure that the program written to exemplary FPGA is desired by the user at step 95. If the program is correct, then a determination is made that a programmed test is ready to begin at step 103. Unlike current testers, if the program is not what the user requires or desires, the user can directly program said FPGA at step 99, in any configuration, and then begin reconfigured test at step 103. Existing testers are pre-programmed by manufacturers and so a user may only choose between a finite number of testing configurations.

If the user opts to directly program said FPGA at step 99, in one embodiment the user should be aware that any data programmed onto exemplary FPGA that is not stored onto a storage device, e.g., PROM (37), can be lost after a power cycle. A user may also reprogram exemplary PROM at step 97, which will ensure that a desired program is stored after a power cycle. When exemplary PROM (e.g., 37) is programmed at step 97, power to exemplary Tester (e.g., 83) is cycled at step 101. Recycling the power at step 101 to exemplary Tester (e.g., 83) can restart testing sequence(s) and exemplary PROM (e.g. 37) will write new stored data to exemplary FPGA (e.g., 43) at step 93.

Figure 6:
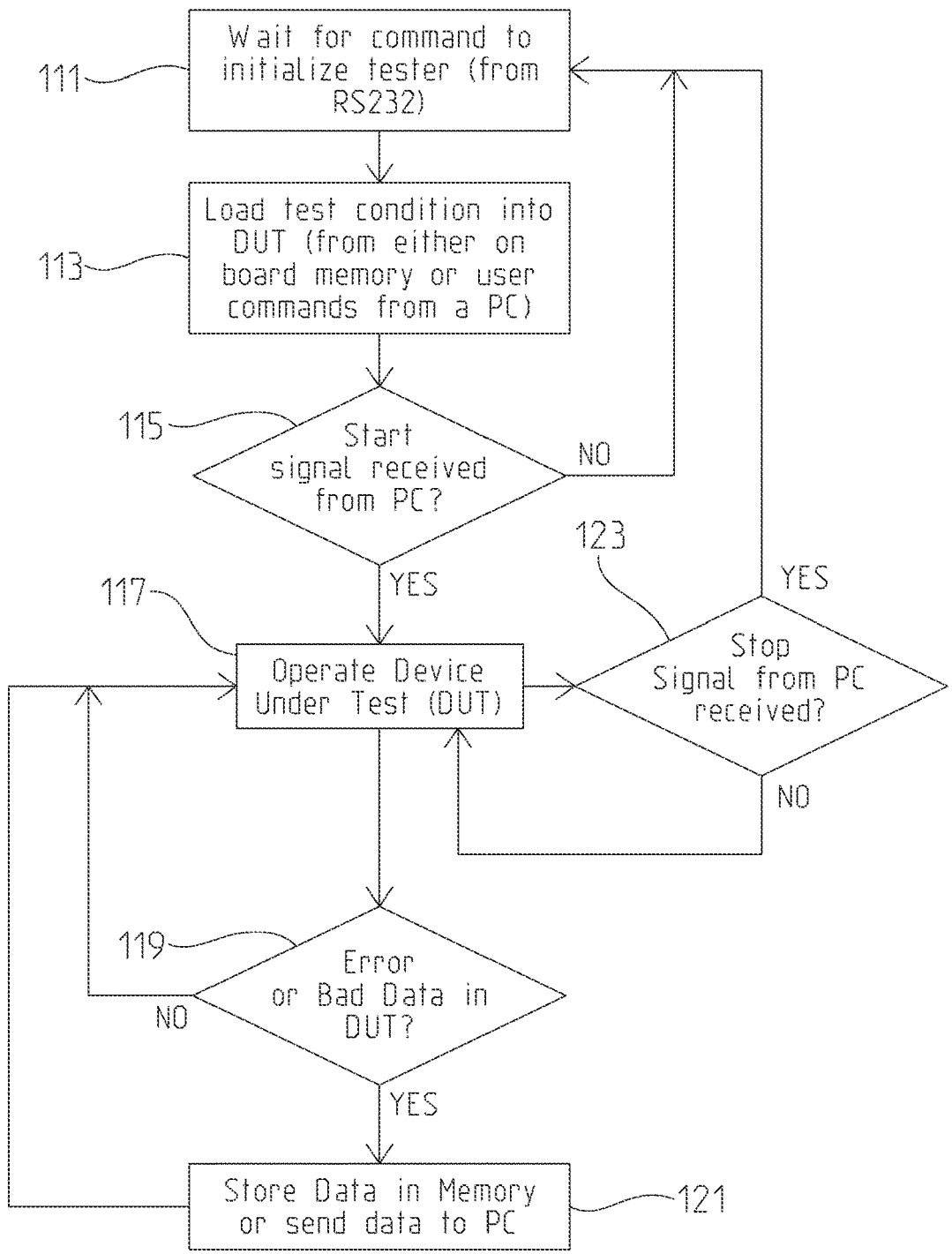
FIG. 6 shows an overview of one software architecture of the FPGA in accordance with one embodiment of the invention.

FIG. 6 shows an overview of one example of software architecture of an exemplary FPGA (e.g., 43) in accordance with one embodiment of the invention. Once a test is ready to begin, an exemplary Tester (e.g., 83) will wait for a command to initialize Tester (e.g., 83) at step 111 through a user command (e.g., through an RS232 connector (e.g. 90)). Once exemplary test is initialized, test conditions are loaded into exemplary DUT (e.g., 87) at step 113 by and though an exemplary Tester (e.g., 83). Exemplary Tester (e.g., 83) can be fully customized by a user. An exemplary user may program a Tester (e.g. 83) FPGA (e.g., 43) or multiple Testers using, e.g., a PROM (e.g., 37), or through other exemplary embodiments. A start signal is received from a computer or control system at step 115 which will initiate exemplary DUT (e.g., 87) (can be either directly via or through Tester (e.g., 83)) at step 117. As an exemplary test is run, if an error or bad data is perceived in exemplary DUT at step 119, resulting test output data can be stored in a memory device or sent to an exemplary control system or computer at step 121. If no error or bad data is received at step 119, exemplary DUT will continue to operate at step 117 until a stop signal is received from exemplary control system or computer 123, at which time, exemplary Tester will stop and await another command to initialize at step 111.

Figure 7:
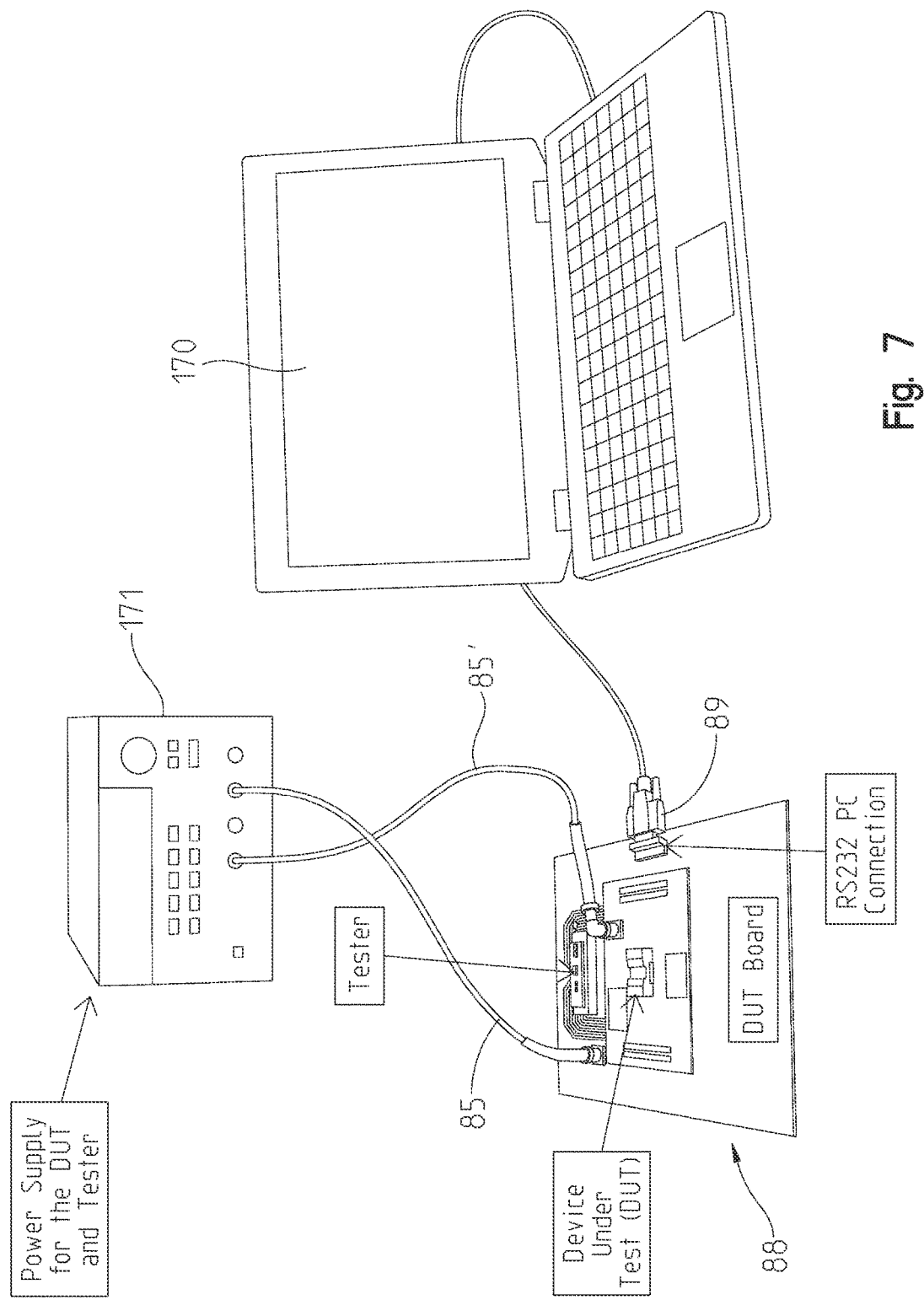
FIG. 7 shows one configuration or embodiment of the invention in one operational configuration.

FIG. 7 shows one configuration or embodiment of the invention in one operational configuration. In this embodiment, DUT Test Assembly 88 (e.g., shown in FIGS. 4*a*-4*e*) can be supplied with power from a power supply 171 through power cables 85, 85'. Information from exemplary DUT Test System Assembly 88 is transferred from exemplary DUT Test System Assembly 88 to a control system or computer 170 through, e.g., RS232 cable 89. Data results or commands can be viewed or utilized through a graphical user interface on the control system or computer 170.

Figure 8:
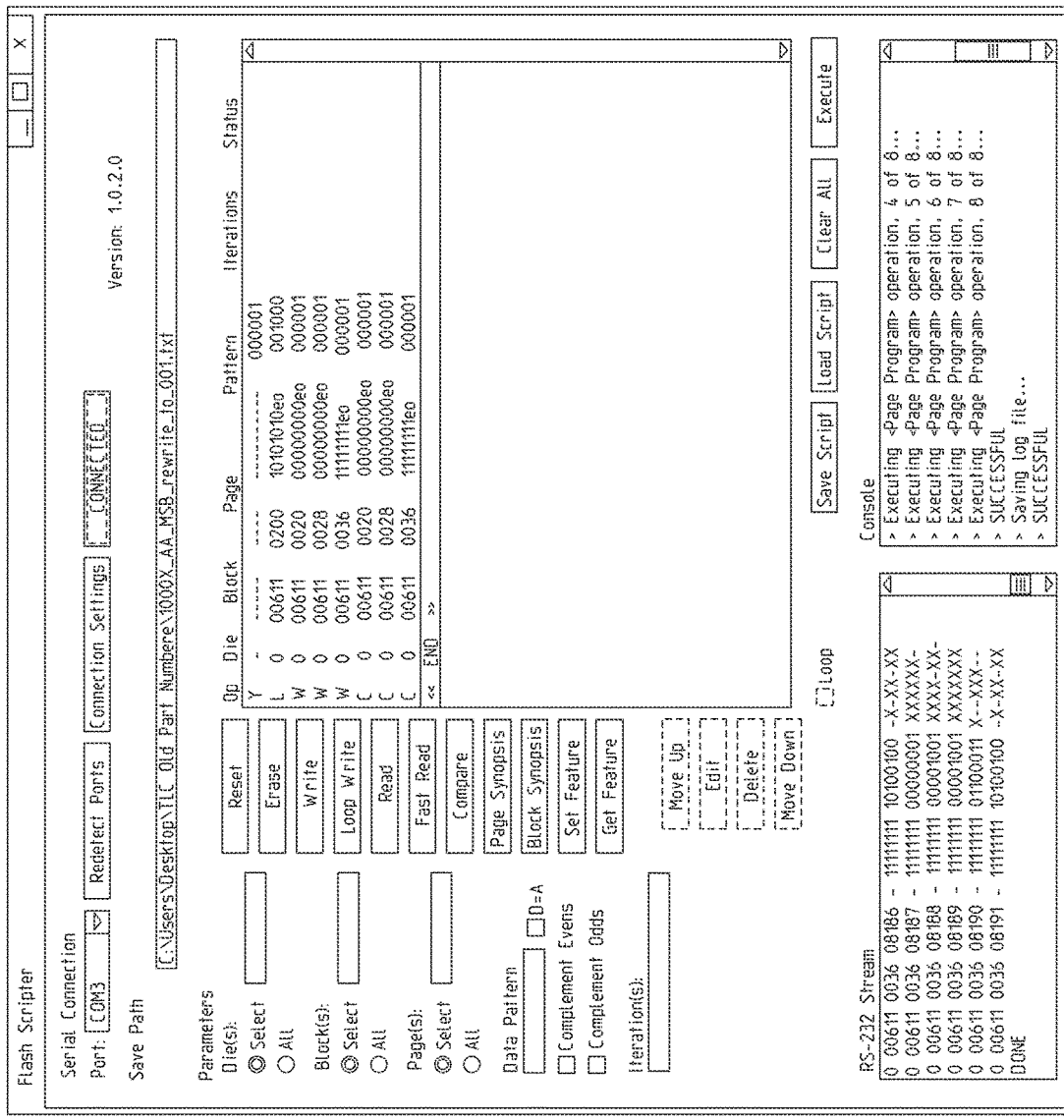
FIG. 8 shows an example of a computer program stored on a machine interpretable recording medium receiving data from an exemplary test system.

FIG. 8 shows an example of a user interface associated with a computer program stored on a machine interpretable recording medium receiving data from an exemplary test system. The user interface has a variety of features including graphical user interface (GUI) elements such as data connection information (e.g. port (e.g., com3), redetect ports, connection settings, connection status, data on the RS-232 interface, console data, status, parameters, data patterns, operations (e.g. reset, erase, write, loop write, read, fast read, compare, page synopsis, block synopsis, set features, get feature, data output file name save path, script commands (e.g., save script, load script, clear, execute), and other test data (e.g., operation, die, block, page, pattern, iterations, status, etc.).

Figure 9:
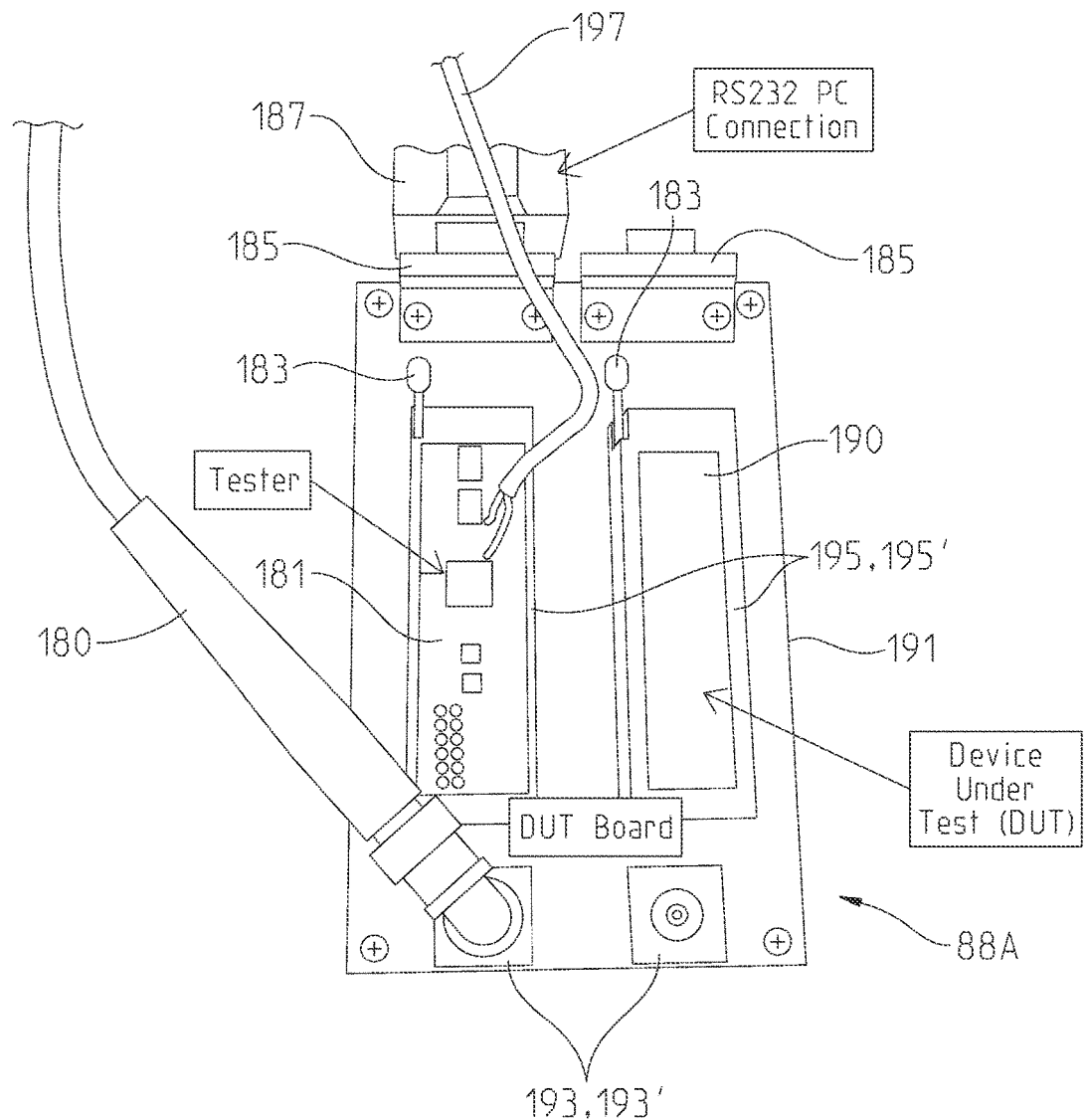
FIG. 9 shows another exemplary configuration of a test system assembly.

FIG. 9 shows another exemplary configuration of a DUT Test System Assembly 88A. This alternative embodiment demonstrates a DUT Board 191 (without use of a DUT Adapter Board) with a size slightly greater than that of exemplary alternative embodiment Tester 181. Exemplary Tester 181 and DUT 190 are both attached to exemplary DUT Board 191 using ZIF connectors 195, 195' (two identical ZIF connectors in this case but they can be different types or sizes) and secured in place by moving ZIF Lever 183 ninety degrees and thereby respectively compressing pins of exemplary Tester 181 and DUT 190 inside said ZIF connector's 195 conductive contacts. Power can be supplied to exemplary Tester 181 and exemplary DUT 190 through DUT Board 191 by way of a coaxial cable 180. Coaxial cable 180 can be connected to a power supply (not shown) and to exemplary DUT Board 191 via a coaxial connector 193. In this embodiment, there are two coaxial connectors 193, 193', one to conduct power to exemplary Tester 181 and one to conduct power to exemplary DUT 190 through electrical traces or tracks on DUT 191 and ZIF connectors 195, 195'. In this embodiment, timing for an FPGA on exemplary Tester 181 can be supplied by a cable 197 providing an oscillator signal (e.g. removal of a component, such as an oscillator, can be done to enable an exemplary system to perform better in a radiation environment thus remotely providing function of a component which is vulnerable to a harsh environment). Tester 181 can have a configuration such as described in, e.g., FIG. 2. Test information or data can be passed from exemplary Tester 181 through conductive traces or tracks on DUT Board 191 to an external interface, e.g., an RS232 connecter 185 which has an RS232 cable 187 attached. Exemplary RS232 cable 187 can be connected to a computer or memory storage device (not shown).

An embodiment can also include a shield case adapted to encase, e.g., a 48-pin DIP and protect the 48-pin DIP from an environmental risk to the DIP (e.g., radiation).

Although the invention has been described in detail with reference to certain preferred embodiments, variations and modifications exist within the spirit and scope of the invention as described and defined in the following claims.

The invention claimed is:

1. A test device comprising:
    a first test structure comprising at least one first interface section and a second interface section, wherein said second interface section comprises an integrated circuit interface section comprising a plurality of programmable input and output elements, wherein said integrated circuit interface section is adapted to removably and electrically connect or release one or more said input and output elements with one or more input and output elements of a device under test (DUT), receive inputs and outputs from said DUT, process said inputs and outputs, and output processed data;
    a second test structure comprising:
        a third interface section adapted to selectively and removably electrically couple with said first interface section of said first structure;
        a power module adapted to modulate incoming power to different voltages from a power supply either on said second test structure or coupled with said second test structure, said power module supplies said different voltages to sections of said first and section test structure comprising one or more said plurality of programmable input and output elements through said first test structure via said third interface section to said first interface section;
        a user selectable voltage switch adapted to enable said user to select between said different voltages by manipulating said switch in different switch selection configurations;
        a programmable read only memory (PROM) adapted to store a first plurality of machine readable instructions and a first plurality of control section, controller, or programmable logic unit configuration settings;
        a control section, controller, or programmable logic unit adapted to perform a plurality of control section, controller, or programmable logic unit operations comprising controlling said DUT and said programmable input and output elements through said third interface section, said control section, controller, or programmable logic unit is configured to couple with said PROM and receive said first plurality of machine readable instructions in an initial testing configuration and said first plurality of control section, controller, or programmable logic unit configuration settings, wherein said control section, controller, or programmable logic unit is further configured to create and store a second plurality of control section, controller, or programmable logic unit configuration settings on said PROM for later reload of said control section, controller, or programmable logic unit from said PROM, wherein said control section, controller, or programmable logic unit is also configured to selectively program said power module to select one of said different voltages and selectively configure and program one or more of said plurality of programmable input and output elements based on said first or second plurality of machine readable instructions, wherein said first and second plurality of machine readable instructions are configured to either reconfigure programmable logic elements within said control section, controller, or programmable logic unit or be executed by different programmable logic elements within said control section, controller, or programmable logic unit to perform said plurality of control section, controller, or programmable logic unit operations;
        an initial configuration load switch configured to transfer a copy of said first plurality of machine readable instructions to said control section, controller, or programmable logic unit to operate said control section, controller, or programmable logic unit in said first testing configuration operable to perform a first plurality of testing operations on said DUT;
        a timing signal generation section operable to supply one or different timing signals to said control section, controller, or programmable logic unit;
        a programming cable connection coupled with said control section, controller, or programmable logic unit adapted to electrically couple with a programming cable configured for receiving and conveying said first plurality of machine readable instructions or a second plurality of machine readable instructions to said control section, controller, or programmable logic unit;
        a plurality of light emitting diodes (LED) coupled with said control section, controller, or programmable logic unit adapted to indicate user programmable indication criteria settings associated with execution of said first or second plurality of machine readable instructions by said control section, controller, or programmable logic unit by outputting a different light emission associated with predetermined said indication criteria that have been met; and
    a communication protocol section adapted to transmit data from said control section, controller, or programmable logic unit through a communication signal data interface adaptor to a computer adapted to analyze said data.

2. The test device as in claim 1, further comprising a third test structure configured to selectively receive and release said second test structure and further electrically interface said second test structure with said first test structure.

3. The test device as in claim 1, wherein said first test structure comprises an integrated circuit package receiving section adapted to receive a DUT comprising a 48-pin dual-inline package (DIP) system, wherein said communication signal data interface comprises an RS232 adapter.

4. The test device as in claim 3, wherein said integrated circuit package receiving section and said 48-pin DIP further comprises a shielding section adapted to prevent or mitigate damage from a radiation environment above a radiation threshold or heat exposure above a thermal threshold.

5. The test device as in claim 3, further comprising a shield case adapted to encase said 48-pin DIP with a radiation shielding material.

6. The test device as in claim 1, wherein said second test structure further comprises said power supply on said second test structure configured to supply power to said power module.

7. The test device as in claim 1, wherein said control section, controller, or programmable logic unit is further configured by said first or second plurality of machine readable instructions to multiply, scale, or adjust said timing signals supplied to said control section, controller, or programmable logic unit from said timing section.

8. The test device as in claim 3, wherein said 48-pin DIP comprises a plurality of input and outputs (I/O) configured to be grounds, one I/O configured to be a voltage input I/O, one I/O configured to be a receive I/O, one I/O configured to be a transmit I/O, and forty I/Os configured to be programmable I/Os.

9. The test device as in claim 3, wherein said user selectable voltage switch comprises a supply voltage VDD I/O switch configured to enable said user to select one of said different voltages to one or more pins of said 48-pin DIP.

10. The test device as in claim 1, wherein said second test structure is formed with an aperture in said test structure passing through said second test structure, said first test structure is substantially positioned over said aperture so as said DUT is entirely over said aperture, said aperture is sized to permit radiation to be passed through said aperture without directly impacting said second test structure.

11. A test device comprising:
a first test structure comprising an adapter board comprising a first electrical signal interface configured with structures for selectively retaining and interfacing with a first plurality of electrical signal input and output (I/O) interface elements, a third electrical signal interface configured with for selectively retaining and interfacing with a second plurality of electrical signal I/O interface elements, a first power supply interface and bus, and a communication interface and bus;
a second test structure comprising a device under test (DUT) board including a DUT interface structure comprising a plurality of programmable DUT I/O elements and a retaining structure adapted to selectively receive, retain, and interface with a plurality of DUT interface elements of said DUT, a second electrical signal interface comprising said first plurality of electrical signal I/O elements removeably coupled with said first electrical signal interface, a DUT board bus structure configured to interface said DUT interface structure with said first test structure interface;
a third test structure comprising:
a fourth electrical signal interface comprising said third plurality of electrical signal I/O elements coupled to a third test structure bus structure selectively coupled with said third electrical signal interface;
a power module coupled with said third test structure bus adapted to modulate incoming power to selectively supply one of a plurality of different voltages to said plurality of programmable DUT I/O elements through said fourth electrical signal interface;
a user selectable voltage switch coupled with said third test structure bus adapted to enable said user to select said one of a plurality of different voltages by manipulating said switch in different switch selection configurations;
a programmable read only memory (PROM) coupled with said third test structure bus adapted to store a first plurality of machine readable instructions and a first plurality of control section, controller, or programmable logic unit configuration settings;
a control section, controller, or programmable logic unit coupled with said third test structure bus adapted to perform a plurality of control section, controller, or programmable logic unit operations comprising controlling said DUT through said fourth electrical signal interface by selectively switching, configuring, or coupling with said programmable DUT I/O elements through said third interface section based on said first plurality of machine readable instructions or a second plurality of machine readable instructions loaded on said control section, controller, or programmable logic unit operable to operate or configure programmable logic blocks on said control section, controller, or programmable logic unit, said control section, controller, or programmable logic unit is configured to selectively couple with said PROM and receive said first plurality of machine readable instructions in an initial testing configuration and said first plurality of control section, controller, or programmable logic unit configuration settings, wherein said control section, controller, or programmable logic unit is further configured to receive or create a second plurality of control section, controller, or programmable logic unit configuration settings, said first or second plurality of machine readable instructions further include instructions operable to configure said control section, controller, or programmable logic unit to store said first plurality of machine readable instructions, said second plurality of machine readable instructions, said first plurality of control section, controller, or programmable logic unit configuration settings, or said second plurality of control section, controller, or programmable logic unit configuration settings on said PROM for later reload or configuration of said control section, controller, or programmable logic unit from said PROM, wherein said is also configured to selectively program said power module to select said one of said plurality of different voltages and selectively configure and program one or more of said plurality of programmable DUT I/O elements based on said first or second plurality of machine readable instructions, wherein said first and second plurality of machine readable instructions are configured to either reconfigure programmable logic elements within said control section, controller, or programmable logic unit or be executed by different programmable logic elements within said control section, controller, or programmable logic unit to perform said plurality of control section, controller, or programmable logic unit operations;

an initial configuration load switch coupled with said third test structure bus configured to transfer a copy of said first plurality of machine readable instructions to said control section, controller, or programmable logic unit to operate said control section, controller, or programmable logic unit in said first testing configuration operable to perform a first plurality of testing operations on said DUT;

a timing signal generation section coupled with said third test structure bus operable to supply one or different timing signals to said control section, controller, or programmable logic unit;

a programming cable connection coupled with said control section, controller, or programmable logic unit adapted to electrically couple with a programming cable configured for receiving and conveying said first plurality of machine readable instructions or said second plurality of machine readable instructions to said control section, controller, or programmable logic unit;

a plurality of light emitting diodes (LED) coupled with said control section, controller, or programmable logic unit through coupled with said third test structure bus adapted to indicate user programmable indication criteria settings associated with execution of said first or second plurality of machine readable instructions by said control section, controller, or programmable logic unit by outputting a different light emission associated with predetermined said indication criteria that have been met; and a communication protocol section adapted to transmit DUT test or operation data from said control section, controller, or programmable logic unit through said fourth electrical signal interface with said communication interface to a computer adapted to analyze said data.

12. The test device as in claim 11, wherein said DUT interface structure comprises an integrated circuit package receiving section adapted to receive a DUT comprising a 48-pin dual-inline package (DIP) system, wherein said communication interface comprises an RS232 adapter.

13. The test device as in claim 12, wherein said integrated circuit package receiving section and said 48-pin DIP further comprises a shielding section adapted to prevent or mitigate damage from a radiation environment above a radiation threshold or heat exposure above a thermal threshold.

14. The test device as in claim 12, further comprising a shield case adapted to encase said 48-pin DIP with a radiation shielding material.

15. The test device as in claim 11, wherein said control section, controller, or programmable logic unit is further configured by said first or second plurality of machine readable instructions to multiply, scale, or adjust said timing signals supplied to said control section, controller, or programmable logic unit from said timing section.

16. The test device as in claim 12, wherein said 48-pin DIP comprises a plurality of I/O elements configured to be grounds, one I/O configured to be a voltage input I/O, one I/O configured to be a receive I/O, one I/O configured to be a transmit I/O, and forty I/Os configured to be programmable I/Os.

17. The test device as in claim 12, wherein said user selectable voltage switch comprises a supply voltage VDD I/O switch configured to enable said user to select one of said different voltages to one or more I/O elements or pins of said 48-pin DIP.

18. The test device as in claim 11, wherein said adapter board further comprises an aperture, said first electrical signal interface is disposed outside and in proximity with said aperture, wherein said DUT interface structure is formed and positioned to position said DUT over said aperture in said first test structure.

19. A method of manufacturing an electronic test device comprising:

providing a device under test (DUT) board;

providing a power supply adapted to supply power to a 48-pin dual-inline package (DIP) coupled with said DUT board; and providing said 48-pin DIP comprising:
a power module adapted to modulate incoming power from said power supply to different voltages adapted to regulate voltage to 1.2V, 1.5V, 1.8V, 2.5V, or 3.3V;
a user selectable voltage switch adapted to enable the user to select between said voltages;
a PROM;
a control section, controller, or programmable logic unit adapted to control I/Os on said 48-pin DIP;
an 80 MHz oscillator adapted to supply timing to said control section, controller, or programmable logic unit;
a programming cable connection adapted to accept a programming cable capable of sending programming instructions to said control section, controller, or programmable logic unit;
a plurality of LEDs adapted to indicate user programmable indication criteria;
a communication protocol adapted to transmit data from said control section, controller, or programmable logic unit through a RS232 adaptor to a computer adapted to analyze said data.

20. The method of claim 19, wherein said coupling between said 48-pin DIP and said DUT board comprises a zero insertion force (ZIF) connection.

21. The method of claim 19, wherein a coaxial cable is used in said providing power step to provide power to said 48-pin DIP.

22. A method of testing a digital electronic device comprising:

releasably coupling receive and transmit input/outputs (I/O) of a device under test (DUT) board with a DUT comprising a 48-pin dual-inline package (DIP);

applying a voltage to said DUT via said DUT board from a tester assembly comprising a control section, controller, or programmable logic unit, a programmable read only memory (PROM), wherein a programmable read only memory (PROM) is adapted to write stored data into a control section, controller, or programmable logic unit comprising control section, controller, or programmable logic unit setting data and a plurality of machine readable instructions operable to program programmable logic blocks on said control section, controller, or programmable logic unit to perform a plurality of control section, controller, or programmable logic unit operations comprising a first plurality of test operations configured to control and operate said DUT, wherein said tester is adapted to receive commands to initialize test sequence, wherein said tester is adapted to read said DUT to test for errors or bad data within said DUT, wherein said tester is adapted to store said error data in a memory device or transmit to said computer, outputting data associated with said plurality of control section, controller, or programmable logic unit operations and data associated with DUT output from to a computer adapted to analyze said data associated with said DUT output and said plurality of control section, controller, or programmable logic unit operations and producing a test report output via an output device comprising one of a display, a printer, or a stored data file on a machine readable recording medium.

23. A method of manufacturing a test device comprising:
providing a first test structure comprising at least one first interface section and a second interface section, wherein said second interface section comprises an integrated circuit interface section comprising a plurality of programmable input and output elements, wherein said integrated circuit interface section is adapted to removably and electrically connect or release one or more said input and output elements with one or more input and output elements of a device under test (DUT), receive inputs and outputs from said DUT, process said inputs and outputs, and output processed data;

providing a second test structure comprising:
   a third interface section adapted to selectively and removably electrically couple with said first interface section of said first structure;
   a power module adapted to modulate incoming power to different voltages from a power supply either on said second test structure or coupled with said second test structure, said power module supplies said different voltages to sections of said first and section test structure comprising one or more said plurality of programmable input and output elements through said first test structure via said third interface section to said first interface section;
   a user selectable voltage switch adapted to enable said user to select between said different voltages by manipulating said switch in different switch selection configurations;
   a programmable read only memory (PROM) adapted to store a first plurality of machine readable instructions and a first plurality of control section, controller, or programmable logic unit configuration settings;
   a control section, controller, or programmable logic unit adapted to perform a plurality of control section, controller, or programmable logic unit operations comprising controlling said DUT and said programmable input and output elements through said third interface section, said control section, controller, or programmable logic unit is configured to couple with said PROM and receive said first plurality of machine readable instructions in an initial testing configuration and said first plurality of control section, controller, programmable logic unit configuration settings, wherein said control section, controller, or programmable logic unit is further configured to create and store a second plurality of control section, controller, or programmable logic unit configuration settings on said PROM for later reload of said control section, controller, or programmable logic unit from said PROM, wherein said control section, controller, or programmable logic unit is also configured to selectively program said power module to select one of said different voltages and selectively configure and program one or more of said plurality of programmable input and output elements based on said first or second plurality of machine readable instructions, wherein said first and second plurality of machine readable instructions are configured to either reconfigure programmable logic elements within said control section, controller, or programmable logic unit or be executed by different programmable logic elements within said control section, controller, or programmable logic unit to perform said plurality of control section, controller, or programmable logic unit operations;
   an initial configuration load switch configured to transfer a copy of said first plurality of machine readable instructions to said control section, controller, or programmable logic unit to operate said control section, controller, or programmable logic unit in said first testing configuration operable to perform a first plurality of testing operations on said DUT;
   a timing signal generation section operable to supply one or different timing signals to said control section, controller, or programmable logic unit;
   a programming cable connection coupled with said control section, controller, or programmable logic unit adapted to electrically couple with a programming cable configured for receiving and conveying said first plurality of machine readable instructions or a second plurality of machine readable instructions to said control section, controller, or programmable logic unit;
   a plurality of light emitting diodes (LED) coupled with said control section, controller, or programmable logic unit adapted to indicate user programmable indication criteria settings associated with execution of said first or second plurality of machine readable instructions by said control section, controller, or programmable logic unit by outputting a different light emission associated with predetermined said indication criteria that have been met; and
   a communication protocol section adapted to transmit data from said control section, controller, or programmable logic unit through a communication signal data interface adaptor to a computer adapted to analyze said data;
   wherein said second test structure size and design of components placed on said first test structure is determined based on a plurality of factors comprising reducing said second test structure size to substantially reduce said second test structure area exposure to a radiation source and reduction of said second test structure's size with respect to said first test structure's size to a predetermined percentage, extension beyond, or ratio with respect to said first test structure size.

24. The method as in claim 23, further comprising a third test structure configured to selectively receive and release said second test structure and further electrically interface said second test structure with said first test structure.

25. The method as in claim 23, wherein said first test structure comprises an integrated circuit package receiving section adapted to receive a DUT comprising a 48-pin dual-inline package (DIP) system, wherein said communication signal data interface comprises an RS232 adapter.

26. The method as in claim 25, wherein said integrated circuit package receiving section and said 48-pin DIP further comprises a shielding section adapted to prevent or mitigate damage from a radiation environment above a radiation threshold or heat exposure above a thermal threshold.

27. The method as in claim 25, further comprising a shield case adapted to encase said 48-pin DIP with an electromagnetic radiation shielding material.

28. The method as in claim 23, wherein said second test structure further comprises said power supply on said second test structure configured to supply power to said power module.

29. The method as in claim 23, wherein said control section, controller, or programmable logic unit is further configured by said first or second plurality of machine readable instructions to multiply, scale, or adjust said timing signals supplied to said control section, controller, or programmable logic unit from said timing section.

30. The method as in claim 25, wherein said 48-pin DIP comprises a plurality of input and outputs (I/O) configured to be grounds, one I/O configured to be a voltage input I/O, one I/O configured to be a receive I/O, one I/O configured to be a transmit I/O, and forty I/Os configured to be programmable I/Os.

31. The method as in claim 25, wherein said user selectable voltage switch comprises a supply voltage VDD I/O switch configured to enable said user to select one of said different voltages to one or more pins of said 48-pin DIP.

32. The method as in claim 23, wherein said second test structure is formed with an aperture in said test structure passing through said second test structure, said first test structure is substantially positioned over said aperture so as said DUT is entirely over said aperture, said aperture is sized to permit radiation to be passed through said aperture without directly impacting said second test structure.

33. A method of manufacturing a test device comprising:
providing a first test structure comprising an adapter board comprising a first electrical signal interface configured with structures for selectively retaining and interfacing with a first plurality of electrical signal input and output (I/O) interface elements, a third electrical signal interface configured with for selectively retaining and interfacing with a second plurality of electrical signal I/O interface elements, a first power supply interface and bus, and a communication interface and bus;
providing a second test structure comprising a device under test (DUT) board including a DUT interface structure comprising a plurality of programmable DUT I/O elements and a retaining structure adapted to selectively receive, retain, and interface with a plurality of DUT interface elements of said DUT, a second electrical signal interface comprising said first plurality of electrical signal I/O elements removeably coupled with said first electrical signal interface, a DUT board bus structure configured to interface said DUT interface structure with said first test structure interface;
providing a third test structure comprising:
a fourth electrical signal interface comprising said third plurality of electrical signal I/O elements coupled to a third test structure bus structure selectively coupled with said third electrical signal interface;
a power module coupled with said third test structure bus adapted to modulate incoming power to selectively supply one of a plurality of different voltages to said plurality of programmable DUT I/O elements through said fourth electrical signal interface;
a user selectable voltage switch coupled with said third test structure bus adapted to enable said user to select said one of a plurality of different voltages by manipulating said switch in different switch selection configurations;
a programmable read only memory (PROM) coupled with said third test structure bus adapted to store a first plurality of machine readable instructions and a first plurality of control section, controller, or programmable logic unit configuration settings;
a control section, controller, or programmable logic unit coupled with said third test structure bus adapted to perform a plurality of control section, controller, or programmable logic unit operations comprising controlling said DUT through said fourth electrical signal interface by selectively switching, configuring, or coupling with said programmable DUT I/O elements through said third interface section based on said first plurality of machine readable instructions or a second plurality of machine readable instructions loaded on said control section, controller, or programmable logic unit operable to operate or configure programmable logic blocks on said control section, controller, or programmable logic unit, said control section, controller, or programmable logic unit is configured to selectively couple with said PROM and receive said first plurality of machine readable instructions in an initial testing configuration and said first plurality of control section, controller, or programmable logic unit configuration settings, wherein said control section, controller, or programmable logic unit is further configured to receive or create a second plurality of control section, controller, or programmable logic unit configuration settings, said first or second plurality of machine readable instructions further include instructions operable to configure said control section, controller, or programmable logic unit to store said first plurality of machine readable instructions, said second plurality of machine readable instructions, said first plurality of control section, controller, or programmable logic unit configuration settings, or said second plurality of control section, controller, or programmable logic unit configuration settings on said PROM for later reload or configuration of said control section, controller, or programmable logic unit from said PROM, wherein said control section, controller, or programmable logic unit is also configured to selectively program said power module to select said one of said plurality of different voltages and selectively configure and program one or more of said plurality of programmable DUT I/O elements based on said first or second plurality of machine readable instructions, wherein said first and second plurality of machine readable instructions are configured to either reconfigure programmable logic elements within said control section, controller, or programmable logic unit or be executed by different programmable logic elements within said control section, controller, or programmable logic unit to perform said plurality of control section, controller, or programmable logic unit operations;
an initial configuration load switch coupled with said third test structure bus configured to transfer a copy of said first plurality of machine readable instructions to said control section, controller, or programmable logic unit to operate said control section, controller, or programmable logic unit in said first testing configuration operable to perform a first plurality of testing operations on said DUT;
a timing signal generation section coupled with said third test structure bus operable to supply one or different timing signals to said control section, controller, or programmable logic unit;

a programming cable connection coupled with said control section, controller, or programmable logic unit adapted to electrically couple with a programming cable configured for receiving and conveying said first plurality of machine readable instructions or said second plurality of machine readable instructions to said control section, controller, or programmable logic unit;

a plurality of light emitting diodes (LED) coupled with said control section, controller, or programmable logic unit through coupled with said third test structure bus adapted to indicate user programmable indication criteria settings associated with execution of said first or second plurality of machine readable instructions by said control section, controller, or programmable logic unit by outputting a different light emission associated with predetermined said indication criteria that have been met; and a communication protocol section adapted to transmit DUT test or operation data from said control section, controller, or programmable logic unit through said fourth electrical signal interface with said communication interface to a computer adapted to analyze said data.

34. The method as in claim 33, wherein said DUT interface structure comprises an integrated circuit package receiving section adapted to receive a DUT comprising a 48-pin dual-inline package (DIP) system, wherein said communication interface comprises an RS232 adapter.

35. The method as in claim 34, wherein said integrated circuit package receiving section and said 48-pin DIP further comprises a shielding section adapted to prevent or mitigate damage from a radiation environment above a radiation threshold or heat exposure above a thermal threshold.

36. The method as in claim 34, further comprising a shield case adapted to encase said 48-pin DIP with a radiation shielding material.

37. The method as in claim 33, wherein said control section, controller, or programmable logic unit is further configured by said first or second plurality of machine readable instructions to multiply, scale, or adjust said timing signals supplied to said control section, controller, or programmable logic unit from said timing section.

38. The method as in claim 34, wherein said 48-pin DIP comprises a plurality of I/O elements configured to be grounds, one I/O configured to be a voltage input I/O, one I/O configured to be a receive I/O, one I/O configured to be a transmit I/O, and forty I/Os configured to be programmable I/Os.

39. The method as in claim 34, wherein said user selectable voltage switch comprises a supply voltage VDD I/O switch configured to enable said user to select one of said different voltages to one or more I/O elements or pins of said 48-pin DIP.

40. The method as in claim 33, wherein said adapter board further comprises an aperture, said first electrical signal interface is disposed outside and in proximity with said aperture, wherein said DUT interface structure is formed and positioned to position said DUT over said aperture in said first test structure.

* * * * *